United States Patent [19]

Kawakami et al.

[11] Patent Number: 5,192,717
[45] Date of Patent: Mar. 9, 1993

[54] PROCESS FOR THE FORMATION OF A POLYCRYSTALLINE SEMICONDUCTOR FILM BY MICROWAVE PLASMA CHEMICAL VAPOR DEPOSITION METHOD

[75] Inventors: Soichiro Kawakami, Hikone; Masahiro Kanai, Tokyo; Takeshi Aoki, Machida, all of Japan

[73] Assignee: Canon Kabushiki Kaisha, Tokyo, Japan

[21] Appl. No.: 799,900

[22] Filed: Dec. 2, 1991

Related U.S. Application Data

[63] Continuation of Ser. No. 515,640, Apr. 27, 1990, abandoned.

[30] Foreign Application Priority Data

| Apr. 28, 1989 | [JP] | Japan | 1-107391 |
| Apr. 28, 1989 | [JP] | Japan | 1-107392 |
| Apr. 20, 1990 | [JP] | Japan | 1-102926 |

[51] Int. Cl.$^5$ .............. H01L 21/00; H01L 21/02; H01L 21/306
[52] U.S. Cl. ................ 439/233; 437/967; 148/DIG. 122; 427/571; 427/575; 427/573
[58] Field of Search ............ 437/225, 228, 233, 967; 427/38, 39; 156/643; 118/50.1; 148/DIG. 122

[56] References Cited

U.S. PATENT DOCUMENTS

| 4,262,035 | 4/1981 | Jaeger et al. | 427/45.1 |
| 4,579,623 | 4/1986 | Suzuki et al. | 427/39 |
| 4,705,595 | 11/1987 | Okudaira et al. | 156/643 |
| 4,795,529 | 1/1989 | Kawasaki | 427/38 |
| 4,818,326 | 4/1989 | Liv et al. | 156/345 |
| 4,898,118 | 2/1990 | Murakami et al. | 118/723 |

Primary Examiner—Brian E. Hearn
Assistant Examiner—B. Everhart
Attorney, Agent, or Firm—Fitzpatrick, Cella, Harper & Scinto

[57] ABSTRACT

A process for forming a high quality polycrystalline semiconductor film on an insulating substrate which comprises using a MW-PCVD apparatus comprising a plasma generation chamber provided with a microwave introducing means and a film-forming chamber connected through a grid electrode to said plasma generation chamber, said film-forming chamber containing said insulating substrate positioned on a substrate holder made of a conductive material being installed therein, producing plasma by contacting a film-forming raw material gas with a microwave energy applied through said microwave introducing means in said plasma generation chamber and introducing said plasma into said film-forming chamber while applying a high frequency voltage with a frequency in the range of from 20 to 500 MHz between said grid electrode and said substrate holder to thereby cause the formation of said polycrystalline semiconductor film on said insulating substrate maintained at a desired temperature.

4 Claims, 18 Drawing Sheets

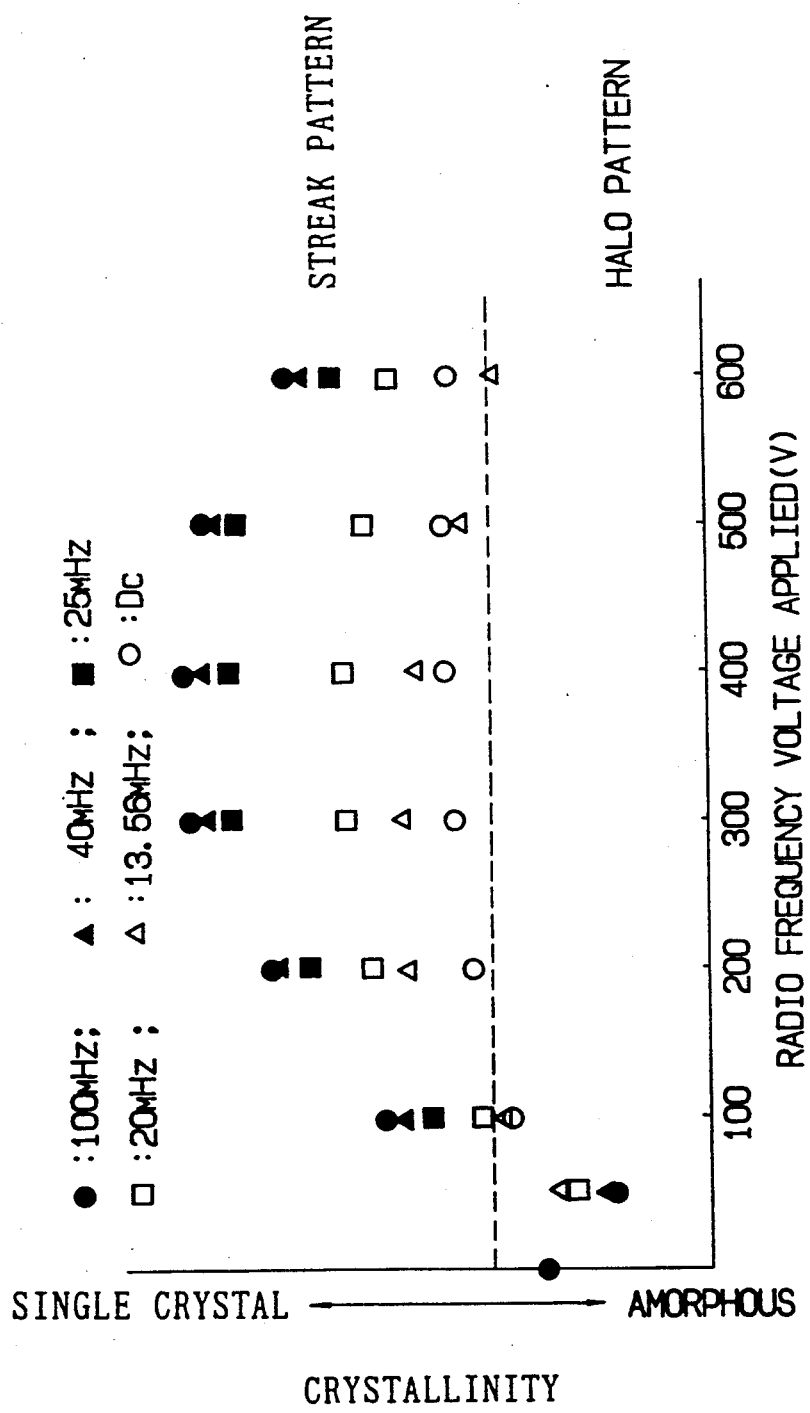

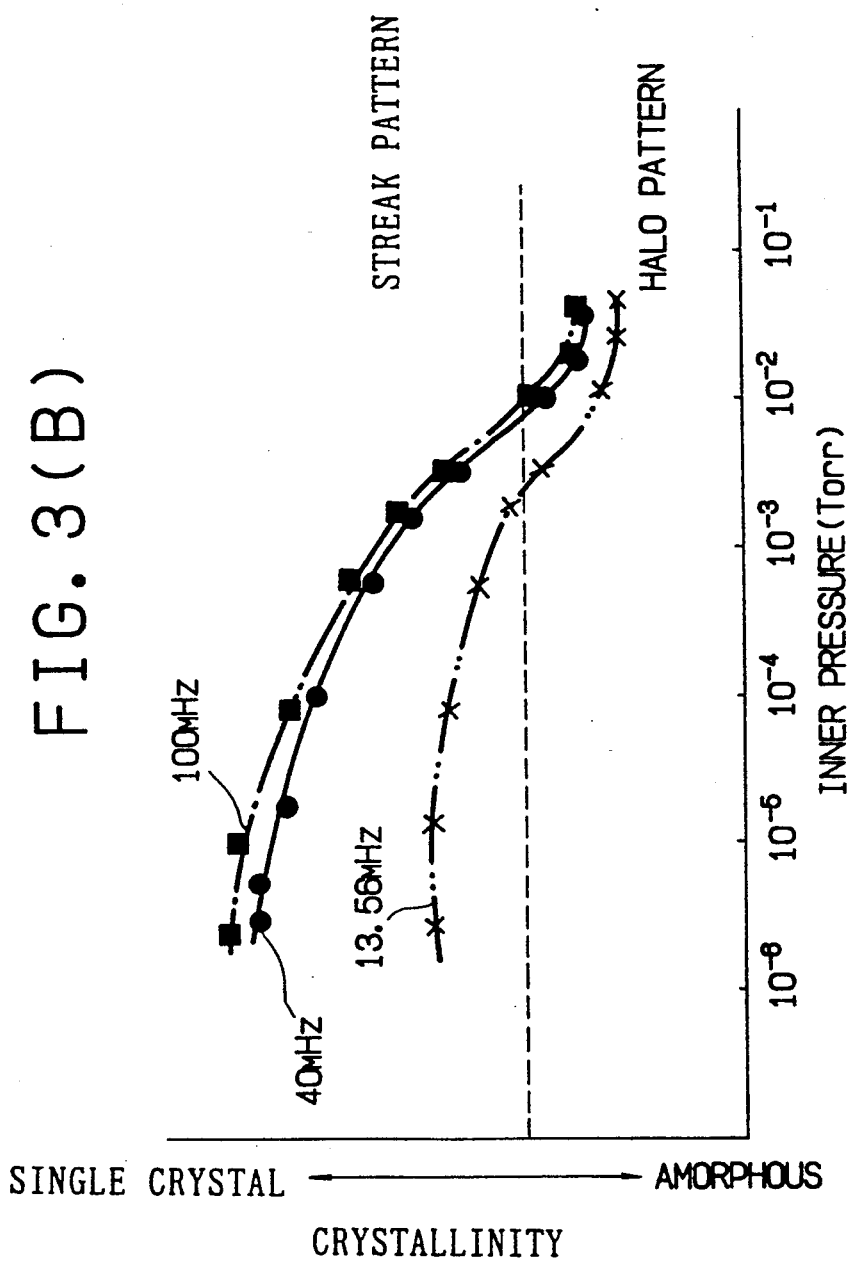

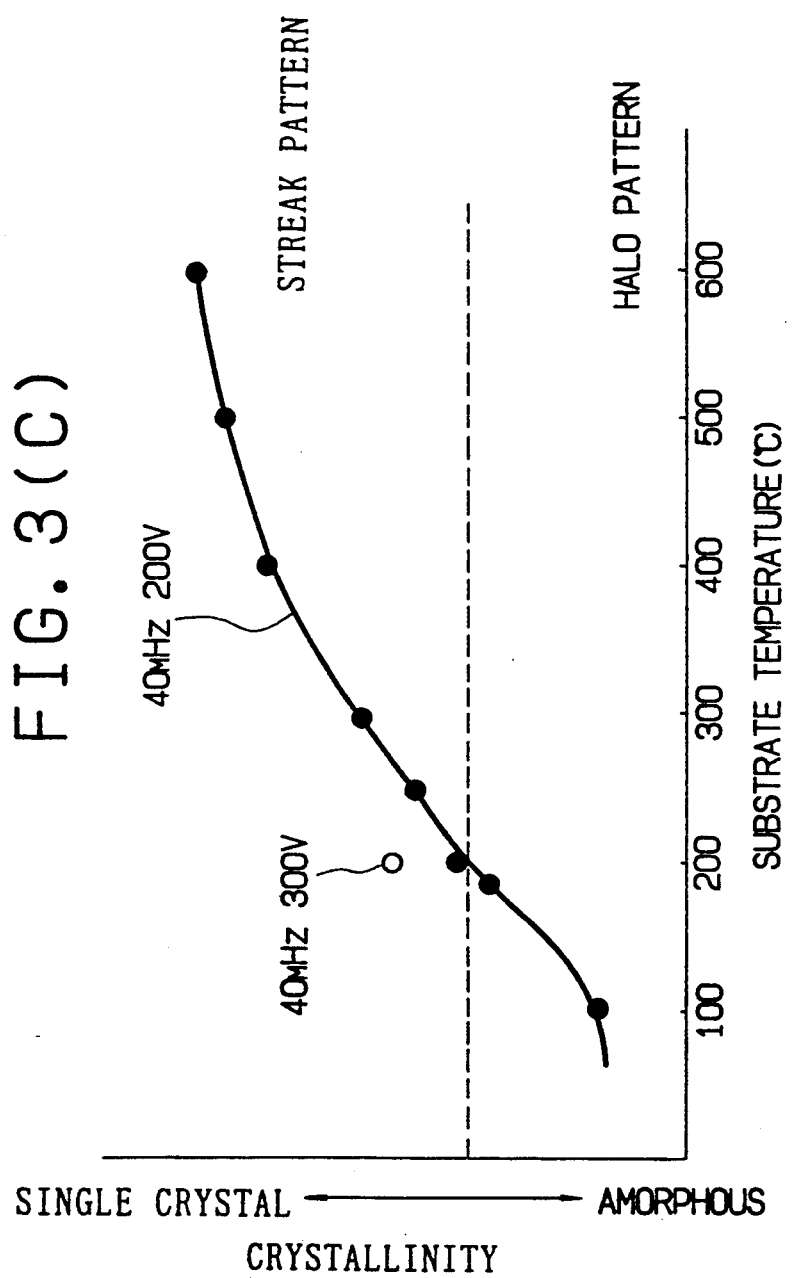

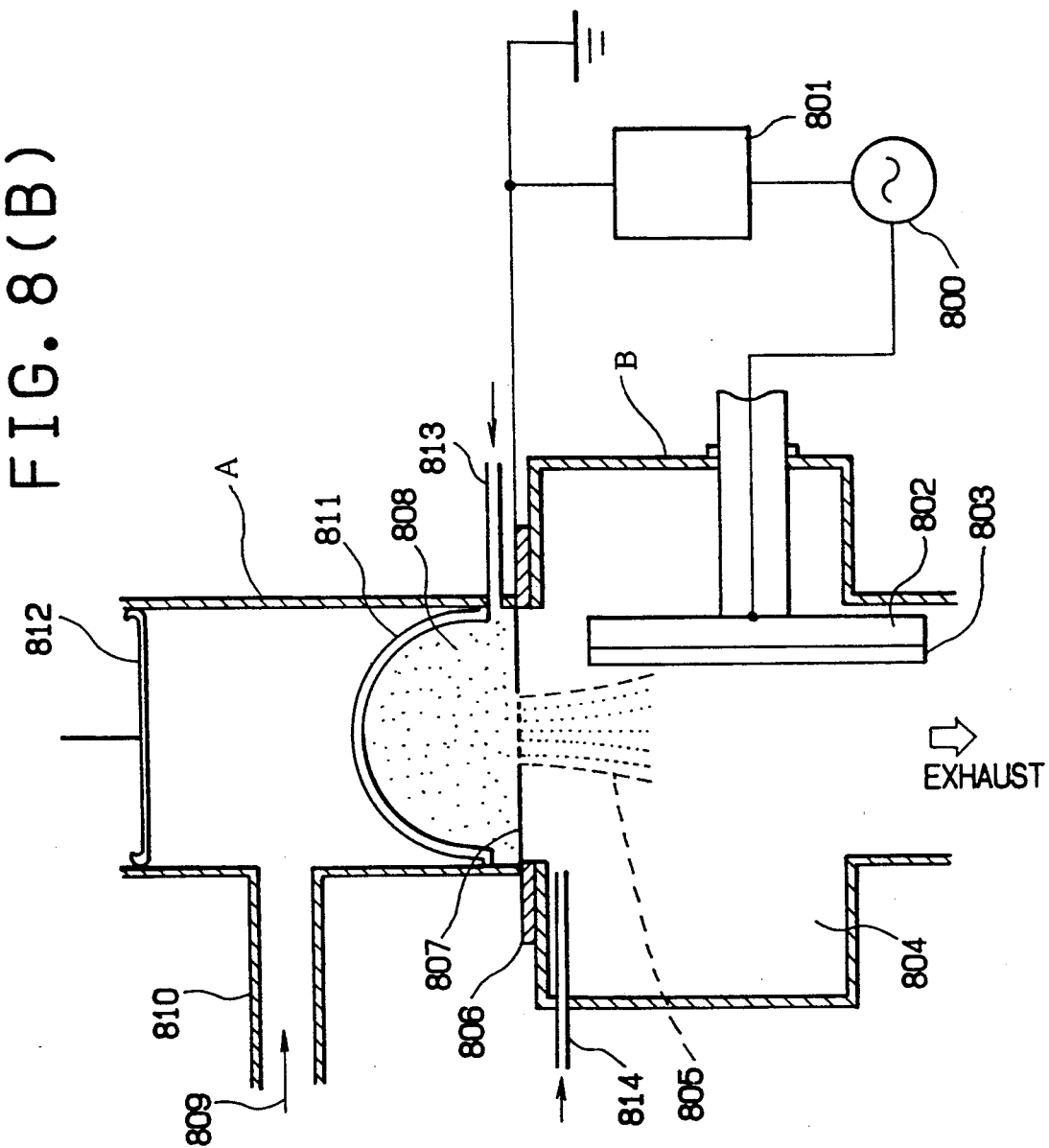

PROCESS FOR THE FORMATION OF A POLYCRYSTALLINE SEMICONDUCTOR FILM BY MICROWAVE PLASMA CHEMICAL VAPOR DEPOSITION METHOD

This application is a continuation of application Ser. No. 07/515,640 filed Apr. 27, 1990, now abandoned.

FIELD OF THE INVENTION

The present invention relates to an improvement in the microwave plasma chemical vapor deposition process (hereinafter referred to as "MW-PCVD process") for forming a polycrystalline semiconductor film on an insulating substrate. More particularly, the present invention relates to an improved MW-PCVD process for forming a polycrystalline semiconductor film on an insulating substrate wherein a raw material gas is decomposed by the action of a microwave energy in the plasma generation chamber to generate plasma. This is followed by passing through the decompose gas a perforated grid electrode into the film-forming chamber having an insulating substrate disposed on a substrate holder comprising an electrically conductive material therein while applying a high frequency voltage with a frequency in the range of from 20 to 500 MHz applied between said grid electrode and said substrate holder, whereby a desirable ion profile is formed in the vicinity of the surface of said insulating substrate and the formation of said polycrystal semiconductor film is effected on said surface.

BACKGROUND OF THE INVENTION

In recent years, the public attention has been focused on a liquid crystal display because it is capable of replacing the Braun tube since it can be designed to be as thin as desired and it can be operated with a minimum consumption of power. In view of this, in order to improve the functions of such liquid crystal display, polycrystalline silicon thin film transisters (hereinafter referred to as "polycrystalline silicon TFT") have been highlighted and various studies have been made thereon.

The studies on the polycrystalline silicon TFT have been made with the view of effectively forming a polycrystalline silicon semiconductor film on a commercially available insulating substrate such as a soda-lime glass at a low deposition temperature. However, at the present time, an industrially applicable film-forming process which makes it possible to stably and repeatedly form a high quality polycrystalline semiconductor film on such commercially valiable insulating substrate has not yet been realized.

Incidentally, a number of proposals have been made with respect to the plasma chemical vapor deposition process utilizing RF glow discharge, which is generally known as RF glow discharge decomposition process. In accordance with the RF glow discharge decomposition process, it is possible to form a polycrystalline semi-conductor film on an insulating substrate at a relatively high deposition temperature by means of RF glow discharge in a raw material gas to decompose said raw material gas and produce plasma causing film deposition.

However, there are disadvantages for the RF glow discharge decomposition process that the utilization efficiency of a film-forming raw material gas is not satisfactory; there exist a number of film-forming parameters which are organically interrelated with each other and it is extremely difficult to generalize them; and thus, it is difficult to stably and repeatedly obtain a desirable polycrystalline semiconductor film with a high yield.

In order to eliminate these disadvantages for the RF glow discharge decomposition process, attention has been focused on the microwave plasma vapor deposition process (MW-PCVD process) using a microwave power instead of the RF power (high frequency power) wherein a raw material gas is decomposed with the action of a microwave energy to produce plasma causing the formation of a deposited film on a substrate. It is possible to form a polycrystalline semiconductor film on an insulating substrate by the MW-PCVD process. For the MW-PCVD process, there are advantages that plasma causing the formation of a deposited film is produced with a higher density and a film is formed with a higher deposition rate respectively in comparison with those in the case of the RF glow discharge decomposition process. However, as in the case of the RF glow discharge decomposition process, there are disadvantages for the MW-PCVD process. That is, there exist a number of film-forming parameters which are organically interrelated with each other and it is extremely difficult to generalize them, and it is difficult to stably and repeatedly obtain a desirable polycrystalline semi-conductor film with a high yield.

In order to improve the above MW-PCVD process, there has been proposed an electron cyclotron resonance plasma chemical vapor deposition process (hereinafter referred to as "ECR plasma CVD process") which comprises applying magnetic field in the MW-PCVD process. For the ECR plasma CVD process, it has been reported that it is possible to form a polycrystalline semiconductor film with reduced defects more efficiently, at a lower deposition temperature and at an improved deposition rate in comparison with the case of the MW-PCVD process. However, in the factual situation for the ECR plasma CVD process, there are still unsolved problems that in order to obtain a desirable polycrystal semiconductor film, it is required to properly adjust not only the conditions for generating plasma from a raw material gas with the action of a microwave energy but also the conditions for controlling ion energy in the plasma by the application of a magnetic field; it is difficult to properly adjust the foregoing two kinds of conditions in terms of organic interrelation to be in a desired state which allows the formation of such desirable polycrystalline semiconductor film; and because of this, it is difficult to stably and repeatedly obtain a desirable polycrystalline semiconductor film.

An example of the ECR plasma CVD process is described in Column 31P-K-2 of Advance Summary for 1985 Spring Meeting of Applied Physics Society. This literature discloses an ECR plasma CVD process for forming a polycrystalline silicon film or a single crystal silicon film on a single crystal silicon wafer using the reactive ion beam deposition (RIBD) apparatus having the constitution shown in FIG. 6. The apparatus shown in FIG. 6 comprises a plasma generation chamber 601 having a plasma generation space and a deposition chamber 602 having a film-forming space. The upper wall of the plasma generation chamber 601 is hermetically provided with a microwave introducing window 603 connected to a waveguide 604 extending from a microwave power source (not shown). Numeral reference 612 stands for a lower wall of the plasma generation chamber 601 which is constituted by an insulating member and which has a hole through which plasma generated in the plasma generation space of the plasma generation chamber 601 passes into the film-forming space of the deposition chamber 602.

Numeral reference 611 stands for a grid electrode comprising a metal mesh plate for applying an electric field which is placed on the lower wall 612 such that the hole of the lower wall is apparently sealed thereby.

Numeral reference 605 stands for a gas feed pipe extending from a gas reservoir (not shown) in which a raw material gas is contained. Numeral reference 610 stands for a cooling unit provided with the outer wall of the plasma generation chamber 601.

Numeral reference 610' stands for a pipe for supplying a cooling water into the cooling unit 610 and numeral reference 610" stands for a pipe for recycling the cooling water from the cooling unit 610. Numeral reference 609 stands for a magnet which is so provided as to surround the plasma generation chamber 601.

The deposition chamber 602 has a hole with its upper wall through which plasma generated in the plasma generation space of the plasma generation chamber 601 is allowed to pass into the film-forming space of the deposition chamber 602. The deposition chamber 602 is provided with an exhaust pipe connected through an exhaust valve to a vacuum pump (this part is not shown). Numeral reference 613 stands for a conductive substrate comprising a single crystal silicon wafer placed on a conductive substrate holder 608. Numeral reference 607 stands for a flow of the plasma from the plasma generation space. Numeral reference 600 stands for a D.C. power source electrically connected to the grid electrode 611. The power source 600 is electrically connected also to the substrate holder 608 while being electrically grounded.

The process to be practiced by the use of the apparatus shown in FIG. 6 which is described in the foregoing literature is to form a polycrystalline silicon film on the single crystal silicon wafer 613 placed on the conductive substrate holder 608 by introducing SiH4 gas through the gas feed pipe 605 into the plasma generation chamber 601, applying a microwave energy through the microwave introducing window 603 into the plasma generation space while effecting a magnetic field in the plasma generation space by the magnet 609 and applying a D.C. bias voltage between the grid electrode 611 and the conductive substrate holder 608 by the D.C. power source 600 to cause an ECR type microwave discharge of generating plasma which is followed to pass through the grid electrode into the film-forming space of the deposition chamber 602, whereby a polycrystalline silicon film is formed on the single crystal silicon wafer 613 maintained at 200° C. Likewise, the foregoing literature discloses the formation of a crystal silicon film by causing homoepitaxial growth on a single crystal silicon wafer maintained at 400° C.

The inventors of the present invention have used a commercially available glass plate (trade name: No. 7059 glass plate, product by Corning Glass Works) instead of the foregoing single crystal silicon wafer 613 and have tried to form a polycrystal silicon film on said glass plate maintained at 400° C. by repeating the film-forming procedures described in the foregoing literature. As a result, it has been found that a practically acceptable polycrystalline silicon film is rarely formed on the insulating substrate (glass plate).

The reason why a practically acceptable polycrystalline silicon film could not be obtained in this case is considered due to that a D.C. bias voltage was not effectively applied between the grid electrode 611 and the substrate 613 because said substrate was insulating. Another factor considered is the reason that lattice matching was not effected for a film to be formed during its formation because the substrate 613 was not a single crystal silicon wafer but an insulating glass plate.

In view of the above, it is difficult to stably and repeatedly form a high quality polycrystalline semi-conductor film of large area on an insulating substrate such as a glass plate which is desirably usable in a TFT by any of the known plasma CVD film-forming methods.

Now, there has been proposed a TFT having a semiconductor layer comprised of a polycrystalline silicon film to be used in a liquid display of active matrix system (this TFT will be hereinafter referred to as "active matrix polycrystalline silicon TFT"). This active matrix polycrystalline silicon TFT is generally prepared in the following way. That is, a transparent electrode comprising an ITO film is formed on a high quality insulating transparent substrate such as a quartz glass plate and thereafter, a polycrystalline silicon film to be the semiconductor layer is formed on said transparent electrode. When the LP-CVD method (low pressure chemical vapor deposition method), which is considered as being effective for the formation of a high quality polycrystalline silicon film, is employed for the formation of said semiconductor layer, silane gas is used as the film-forming raw material gas and film-formation is carried out at a film deposition temperature of 700° C. or more. During the film formation, said silane gas is decomposed to generate hydrogen radicals which unavoidably occur at the ITO film being maintained at elevated temperature, where the hydrogen radicals react with the constituent oxygen atoms of the ITO film to make the ITO film opaque. In this case, the opaque ITO film is unable to function as the transparent electrode. In consequence, the resulting active matrix polycrystalline silicon TFT becomes such that is not practically usable. In this respect, the LP-CVD method is not practically applicable for the formation of a polycrystalline silicon film to be the semiconductor layer of the active matrix polycrystalline silicon TFT. There is also another problem in the case of forming the semiconductor layer comprising a polycrystalline silicon film of said TFT by the LP-CVD method that since the film formation is carried out at an elevated temperature of 700° C. or more as described above, a less heat-resistant inexpensive material such as soda-lime glass, synthetic resin film, etc. cannot be used as the substrate.

There is a proposal to form a polycrystalline silicon film to be the semiconductor layer of the active matrix polycrystalline silicon TFT by the molecular-beam evaporation method, wherein said film is formed on an insulating transparent substrate at a deposition temperature of 400° C. and under an ultra-high vacuum condition of about $10^{-10}$ Torr with the use of a single crystal silicon or a polycrystal silicon as the evaporation source. And the active matrix polycrystalline silicon TFT obtained is such that has a ON/OFF electric current ratio in the range of $10^3$ to $10^4$ and a carrier mobility in the range of 2 to 10 cm$^2$/V.s which are not practically acceptable (see, THIN FILM HANDBOOK, p. 625, published Dec. 10 of 1983 by KABUSHIKI KAISHA Ohm Sha of Japan).

SUMMARY OF THE INVENTION

The present invention, aimed at eliminating the foregoing problems in the known process for forming a polycrystalline semiconductor film which is practiced in the apparatus comprising a plasma generation chamber and a film-forming chamber wherein plasma is generated in the plasma generation chamber and the plasma is transported into the film-forming chamber to form said polycrystalline semiconductor film on a substrate placed therein, and providing an improved MW-PCVD process capable of effectively forming various kinds of high quality polycrystalline semiconductor films usable as the constituent elements in various semiconductor devices and electronic devices.

Another object of the present invention is to provide an improved MW-PCVD process which makes it possible to stably and repeatedly form a high quality polycrystalline semiconductor film on a commercially available inexpensive substrate, which is usable as the constituent element in various semiconductor devices and electronic devices.

A further object of the present invention is to provide an improved MW-PCVD process which makes it possible to form a high quality polycrystalline silicon semiconductor film usable as the semiconductor layer of the active matrix TFT and to provide a practically applicable active matrix polycrystalline silicon TFT.

A further object of the present invention is to provide an improved MW-PCVD process which makes it possible to stably and repeatedly form a high quality polycrystalline semiconductor film on a commercially available inexpensive insulating substrate, wherein a film-forming raw material gas is contacted with a microwave energy to produce plasma in a plasma generation chamber and the resulting plasma is supplied through a grid electrode into a film-forming chamber containing the insulating substrate positioned on a conductive substrate holder while applying a high frequency voltage with a specific frequency between the grid electrode and the substrate holder to form a desirable profile of ion energy in the vicinity of the surface of the substrate whereby causing the formation of a high quality polycrystalline semiconductor film on the insulating substrate maintained at a desired temperature.

A further object of the present invention is to provide an improved MW-PCVD process which makes it possible to stably and repeatedly form a high quality polycrystalline semiconductor film on a commercially available inexpensive insulating substrate at a low deposition temperature, wherein a film-forming raw material gas is contacted with a microwave energy to produce plasma in a plasma generation chamber and the resulting plasma is supplied through a perforated grid electrode into a film-forming chamber containing the insulating substrate positioned on a conductive substrate holder while applying a high frequency voltage with a specific frequency between the grid electrode and the substrate holder to desirably control ion energy and the distribution of the ion energy in the plasma in the vicinity of the surface the insulating substrate, whereby the formation of a high quality polycrystalline film is caused on the insulating substrate maintained at a desired low temperature.

BRIEF DESCRIPTION OF THE DRAWINGS

FIG. 3(A) is a view illustrating the interrelations between the high frequency voltages applied and the crystallinities of the deposited films which were obtained in Experiment 5 of the present invention.

FIG. 3(B) is a view illustrating the interrelations between the inner pressures at the time of film formation and the crystallinities of the deposited films which were obtained in Experiment 6.

FIG. 3(C) is a view illustrating the interrelations between the substrate temperatures at the time of film formation and the crystallinities of the deposited films which were obtained in Experiment 7 of the present invention.

FIG. 8(B) is a cross-sectional view schematically illustrating a partial modification of the apparatus shown in FIG. 8(A) in which the substrate holder is so installed as to position a substrate in parallel to the stream of plasma in the film-forming chamber.

DESCRIPTION OF THE INVENTION

Figure 1A:
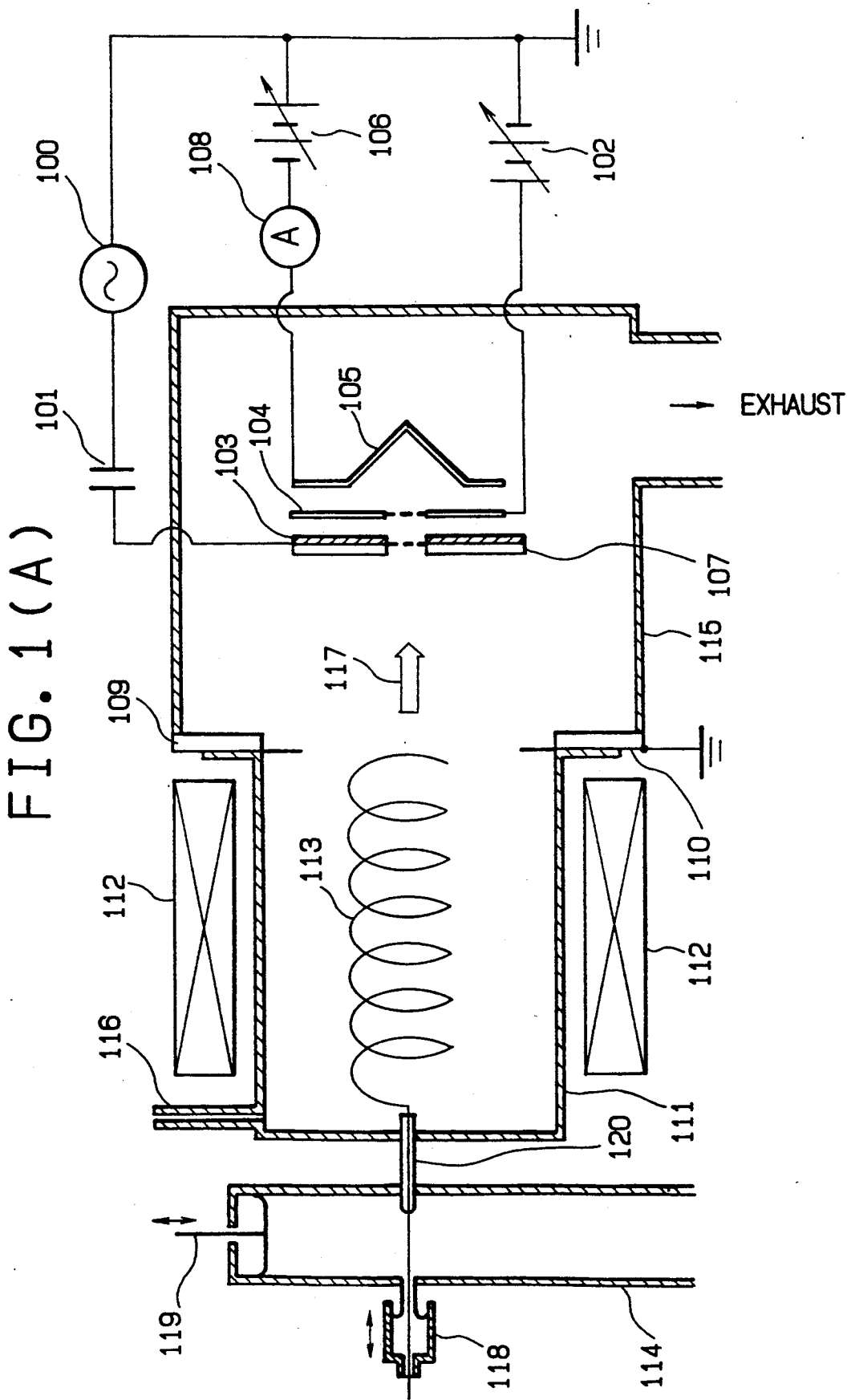
FIG. 1(A) is a cross-sectional view schematically illustrating the constitution of the apparatus for measuring ion energy in plasma which was used in Experiments 1, 3 and 4 of the present invention.

The present inventors have conducted extensive studies through experiments which will be later described in order to solve the problems in the aforementioned conventional processes for forming a polycrystalline semiconductor film and in order to attain the above objects of the present invention. The experiments have been carried out aiming at finding a way to enable one to form a desirable high quality polycrystalline semiconductor film on a commercially available inexpensive insulating substrate such as a sola-lime glass, etc. by the MW-PCVD method. As a result, the present inventors have discovered the following fact.

That is, when the above insulating substrate is positioned on a substrate holder made of a conductive material in a film-forming chamber; a film-forming raw material gas is contacted with a microwave energy to produce plasma in a plasma generation chamber; and the resulting plasma in the plasma generation chamber is successively introduced into the film-forming chamber while applying a specific high frequency voltage between the plasma generation chamber and the conductive substrate holder, ions of the plasma to be supplied toward the surface of the insulating substrate are controlled in a desirable state of being small in energy distribution width to cause the formation of a desirable ion profile in the vicinity of the surface of the insulating substrate and as a result, a high quality polycrystalline semiconductor film is formed on the surface of the insulating substrate. The present inventors have found a further fact that when a magnetic field is effected in the plasma generation chamber in the above case, the density of ions being small in energy distribution width is increased to form a extremely desirable ion profile in the vicinity of the surface of the insulating substrate and as a result, a higher quality polycrystalline semiconductor film is formed on the insulating substrate.

The present invention has been accomplished on the basis of the above findings.

The present invention includes two aspects.

The first aspect of the present invention is to provide an improved MW-PCVD process for forming a high quality polycrystalline semiconductor film which comprises using a MW-PCVD apparatus comprising a plasma generation chamber provided with a microwave introducing means and a film-forming chamber connected through a grid electrode to said plasma generation chamber, said film-forming chamber containing an insulating substrate positioned on a substrate holder made of a conductive material being installed therein, said film-forming chamber being electrically isolated from said plasma generation chamber, producing plasma by contacting a film-forming raw material gas with a microwave energy applied through said microwave introducing means in said plasma generation chamber and introducing said plasma into said film-forming chamber while applying a high frequency voltage with a frequency in the range of from 20 to 500 MHz between said grid electrode and said conductive substrate holder to thereby cause the formation of a high quality polycrystalline semiconductor film on said insulating substrate maintained at a desired temperature.

The second aspect of the present invention is to provide an improved MW-PCVD process for forming a high quality polycrystalline semiconductor film which comprises using a MW-PCVD apparatus comprising a plasma generation chamber provided with a microwave introducing means and a magnetic field effecting means, and a film-forming chamber connected through a grid electrode to said plasma generation chamber, said film-forming chamber containing said insulating substrate positioned on a substrate holder made of a conductive material being installed therein, said film-forming chamber being electrically isolated from said plasma generation chamber, producing plasma by contacting a film-forming raw material gas with a microwave energy applied through said microwave introducing means in said plasma generation chamber while effecting a magnetic field into said plasma generation chamber by said magnetic field effecting means and introducing said plasma into said film-forming chamber while applying a high frequency voltage of a frequency in the range of from 20 to 500 MHz between said grid electrode and said substrate holder to thereby cause the formation of a high quality polycrystalline semi-conductor film on said insulating substrate maintained at a desired temperature.

The present invention enables one to stably and repeatedly form a high quality polycrystalline semiconductor film on an insulating substrate of a large area not at an elevated deposition temperature of 700° C. or more but at a low deposition temperature of 400° C. or less and not under an ultrahigh vacuum condition but under a reasonable inner pressure condition.

In addition to the above advantage, the present invention provides further advantages that there is no occasion for foreign matters contained in an insulating substrate to be liberated to contaminate a polycrystalline film to be formed on said substrate during film-formation since the film-formation is carried out while maintaining the insulating substrate at a low temperature which does not allow such foreign matters to be liberated from said substrate. Because of this, it is not necessary to use a highly heat-resistant expensive substrate such as a quartz glass. It is possible to use a commercially available inexpensive material such as soda-lime glass, synthetic resin films, etc. as the substrate. Thus, the present invention makes it possible to provide semiconductor devices such as TFT, photoelectric conversion devices such as solar cell, etc. respectively having the semiconductor layer comprising a polycrystalline semiconductor film a reduced cost. Especially, the present invention makes it possible to realize a desirable polycrystalline silicon TFT for use in liquid crystal display of active matrix system (the foregoing active matrix polycrystalline silicon TFT) which used to be difficult to realize in the past.

In fact, an active matrix polycrystalline silicon TFT having the semiconductor layer comprising a polycrystalline silicon semiconductor film formed on a commercially available inexpensive transparent insulating material as the substrate exhibits a significant ON/OFF current ratio of the level of $10^5$ and a significant carrier mobility of 50 $cm^2$/V.s or more.

In the following, explanation is to be made on the experiments carried out by the present inventors.

EXPERIMENT 1

In this experiment, the state of a profile of ion energy in the vicinity of the surface of an insulating material to be the substrate on which a film is to be deposited was observed in the case of depositing a film on said insulating material by producing plasma by the decomposition of a raw material gas with the action of a microwave energy in a plasma generation chamber and introducing said plasma into a film-forming chamber containing said substrate positioned on a substrate holder made of a conductive material therein while applying a high frequency voltage between said plasma generation chamber and said substrate holder.

The above observation was carried out by varying the frequency of the high frequency voltage to be applied.

In this experiment, there was observed also about the dependency of the high frequency voltage to be applied versus its frequency.

In order to carry out the experiment, there was used an apparatus for experimental purpose which has the constitution shown in FIG. 1(A). The apparatus shown in FIG. 1(A) comprises a plasma generation chamber 111 and a vacuum vessel 115 corresponding to a film-forming chamber which is connected through an insulating member 109 to the plasma generation chamber such that the vacuum vessel 115 is electrically isolated from the plasma generation chamber 111. Numeral reference 103 is an ion energy controlling electrode having a center portion comprising a metal mesh member, which is installed in the direction perpendicular to a plasma stream 117 in the vacuum vessel 115.

Numeral reference 107 is an insulating plate placed on the ion energy controlling electrode 103, which has a hole at the center portion corresponding to said mesh portion of said electrode 103. Numeral reference 104 is an ion reflecting grid electrode having a center portion comprising a metal mesh member, which is installed behind and in parallel to the ion energy controlling electrode 103 in the vacuum vessel 115. Numeral reference 105 is an ion collecting electrode which is installed behind the ion reflecting grid electrode 104 in the vacuum vessel 115. Each of the ion energy controlling electrode 103, the ion reflecting grid electrode 104 and the ion collecting electrode 105 is electrically connected to a circuit (ion energy measuring circuit) containing a capacitor 101, a variable RF generator 100 (comprising a RF oscillator and an amplifier), a D.C. power source 106 for applying an voltage to prevent input of an electron, a microcurrent electrometer 108, and a D.C. power source 102 for applying a grid voltage. The vacuum vessel 115 is provided with an exhaust pipe connected through an exhaust valve (not shown) to a vacuum pump (not shown).

The plasma generation chamber 111 is provided with a gas feed pipe 116 extending from a gas reservoir containing a raw material gas (not shown). Numeral reference 113 is a microwave introducing helical antenna placed in the plasma generation chamber 111. Numeral reference 112 is an electro-magnet which is so provided as to surround the outer wall of the plasma generation chamber 111. Numeral reference 114 is a waveguide provided with a tuner 119 which is extending from a microwave power source (not shown). The helical antenna 113 is connected through a coaxial vacuum glass tube 120 and the waveguide 114 to a tuner 118. The plasma generation chamber 111 is electrically grounded through an earth electrode 110. In the plasma generation chamber 111, a raw material gas supplied through the gas feed pipe 116 is decomposed with the action of a microwave energy applied by the helical antenna 113 to produce plasma which is fallowed by flowing into the vacuum vessel 115 in the way as expressed by the arrow 117 (illustrating the stream of plasma). As apparent from what described above, the foregoing ion energy measuring circuit is electrically isolated from the plasma generation chamber 111 by the earth electrode 110. The grid electrode 104 functions to guide a selected high energy ion (ion having a high energy of a specific value or more) toward the ion collecting electrode 105 and to reflect the remaining ions. The ion collecting electrode 105 functions to collect those ions passed through the grid electrode 104. The application of a high frequency voltage from the RF generator 100 to the insulating plate 107 and the plasma generation chamber 111 is carried out through the ion energy controlling electrode 103 and the earth electrode 110. The electro-magnet 112 serves to stabilize microwave discharge and promote generation of plasma in the plasma generation chamber 111.

Now, the plasma generation chamber 111 and the vacuum vessel 115 were sufficiently evacuated through the exhaust pipe. $H_2$ gas was introduced through the gas feed pipe 116 into the plasma generation chamber 111 at a flow rate of 4 sccm. The gas pressure (inner pressure) in the plasma generation chamber and the vacuum vessel 115 was maintained at about 5 mTorr by regulating the exhaust valve of the exhaust pipe. Then, the electromagnet 112 was actuated to effect a magnetic field in the plasma generation chamber. At the same time, the microwave power source was switched on to apply a microwave power of 100 W into the plasma generation chamber 111 through the waveguide 114 and the helical antenna 113, to thereby decompose the $H_2$ gas and produce plasma, which was successively flown into the vacuum vessel 115. The electric potential of the ion collecting electrode 105 was adjusted to be −50 V. The positive voltage to be applied onto the grid electrode 104 and the peak to peak voltage ($V_{p-p}$) of a high frequency to be applied onto the ion energy controlling electrode 103 were varied. There was measured the value of an ion current to be flown into the ion collecting electrode 105 by the electrometer 108.

A profile of ion energy (hereinafter referred to as "ion energy profile") was calculated on the basis of the above ion current value measured and the value of the voltage applied onto the grid electrode 104. In this way, there were obtained a plurality of ion energy profiles measured at the respective frequencies of 13.56 MHz, 20 MHz, 25 MHz and 40.7 MHz for the high frequency voltage applied onto the ion energy controlling electrode 103.

The resultant ion energy profiles were shown in FIGS. (A), (B), (C) and (D).

From the results shown in FIGS. (A), (B), (C) and (D), the following facts have been found.

That is, an ion energy peak becomes sharp as the frequency of the high frequency voltage applied is increased. In fact, as apparent from FIG. 2(B), in the case of 13.56 MHz for the frequency of the high frequency voltage as applied, it is recognized that dispersion for the ion energy is significant. It is also recognized that when the $V_{p-p}$ of the frequency to be applied is increased to 40 V, a plurality of energy peaks appear and the dispersion of the ion energy is apparently significant.

Figure 2A:
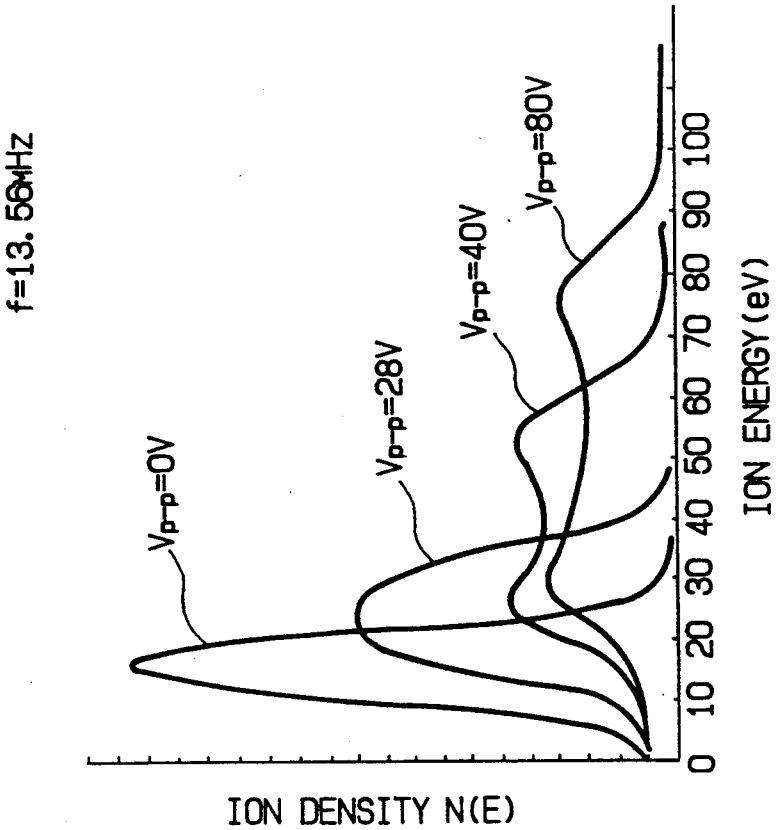
FIG. 2(A) through FIG. 2(D) are views respectively illustrating the ion energy profiles obtained in Experiment 1.
Figure 2B:
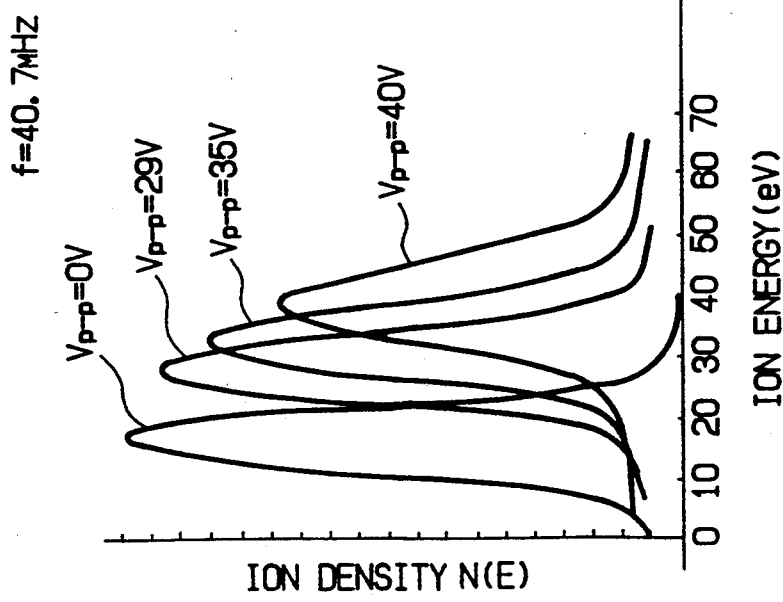

On the other hand, as apparent from FIG. 2(A), in the case of 40.7 MHz for the frequency of the high frequency voltage as applied, it is recognized that the ion energy peak is significantly sharp and even in the case of 40 V for the $V_{p-p}$, the ion energy peak is single.

These facts suggested that it is possible to establish the conditions that an ion energy peak becomes single and sharp by optimizing the frequency of a high frequency voltage to be applied in the case where it is intended to control the ion energy supplied toward the surface of an insulating substrate, on which a film is to be deposited, which is positioned on a conductive substrate holder by applying a high frequency power onto the conductive substrate in the MW-PCVD film-forming process. This means that the dispersion of an ion energy caused by the by-reaction in film-depositing reaction can be prevented.

EXPERIMENT 2

Figure 1B:
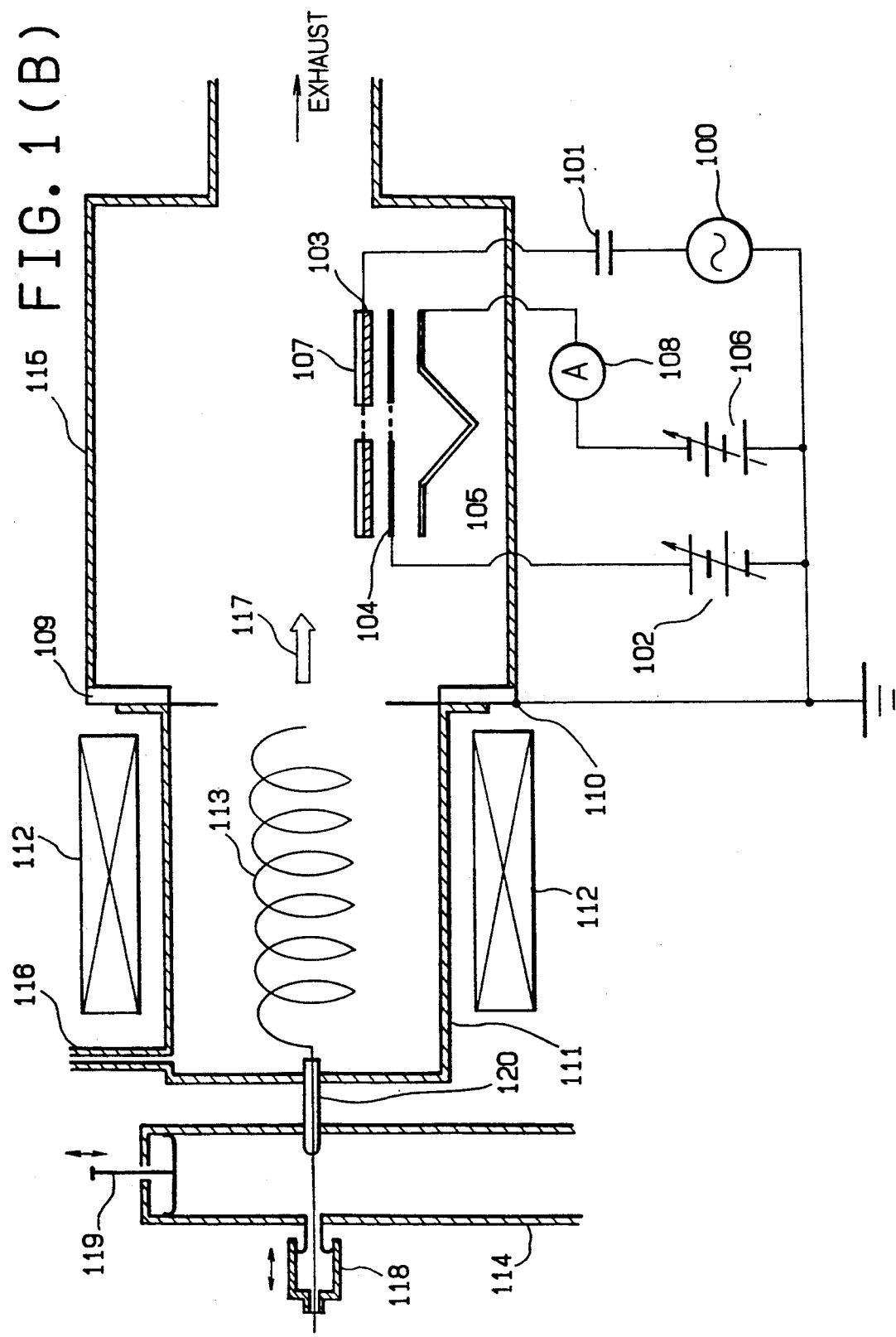
FIG. 1(B) is a cross-sectional view schematically illustrating the constitution of a modification of the apparatus shown in FIG. 1(A) which was used in Experiment 2 of the present invention.

In this experiment, there was observed the influence of a magnetic field to the profile of an ion energy supplied toward an insulating plate using the apparatus shown in FIG. 1(A) and the apparatus shown in FIG. 1(B). The apparatus of FIG. 1(B) is a partial modification of the apparatus of FIG. 1(A), and the former is different from the latter with the point that the ion energy measuring mechanism is installed in parallel to the plasma stream 117 in the vacuum vessel 115.

In this experiment, there were conducted two series of experiments (A) and (B) as will be described below.

Experiment A

The procedures of Experiment 1 were repeated using the apparatus shown in FIG. 1(B) to thereby obtain a plurality of profiles of ion energy vertically impinged in the magnetic field. As a result, it has been found that the effect of applying a high frequency voltage is not provided as much as recognized in Experiment 1.

Experiment B (1) The procedures of Experiment 1 in the case of applying a high frequency voltage with a frequency of 40.7 MHz were repeated using the apparatus shown in FIG. 1(A) without actuating the electro-magnet 112 to thereby measure an ion energy profile. As a result, there were obtained the results shown in FIG. 2(E).

(2) The procedures of Experiment 1 in the case of applying a high frequency voltage with a frequency of 40.7 were repeated using the apparatus shown in FIG. 1(B) without actuating the electro-magnet 112 to thereby measure an ion energy profile. As a result, there were obtained the results shown in FIG. 2(F).

The reason why a marked effect was not provided in Experiment (A) can be explained as follows. That is, when the electric field to be applied onto the ion controlling electrode is quoted as E and the flux density of the magnetic field caused by the electro-magnet 112 is quoted as B, the electric field E becomes to be in the state being orthogonal with the magnetic field and a charged particle is drifted with a value of $E \times B$ in the case where the ion energy measuring mechanism is positioned in parallel to the plasma stream 117. Because of this, a marked effect is not provided as much as in the case where the ion energy measuring mechanism is positioned in the direction perpendicular to the plasma stream 117.

Figure 2D:
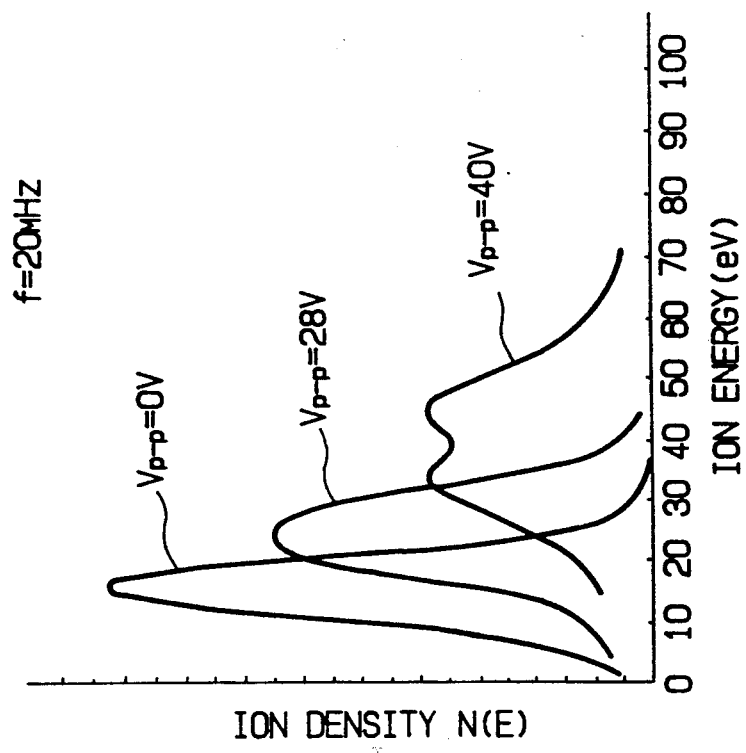
Figure 2C:
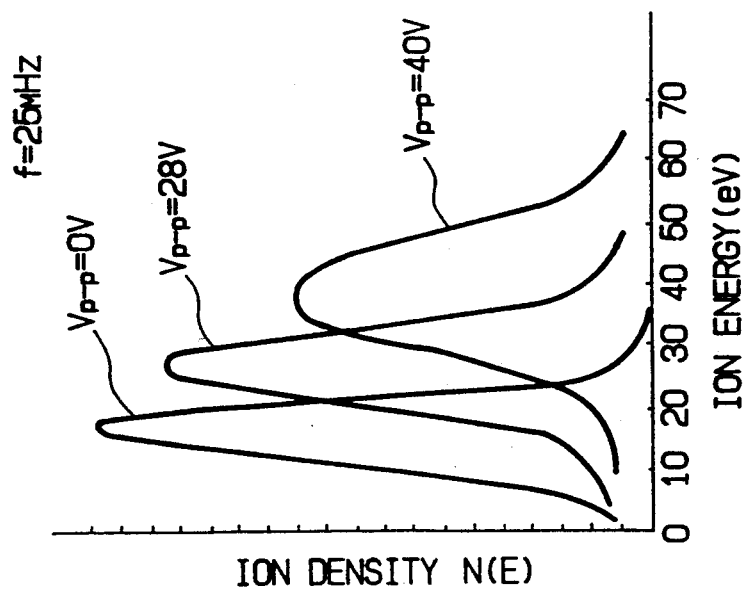
Figure 2E:
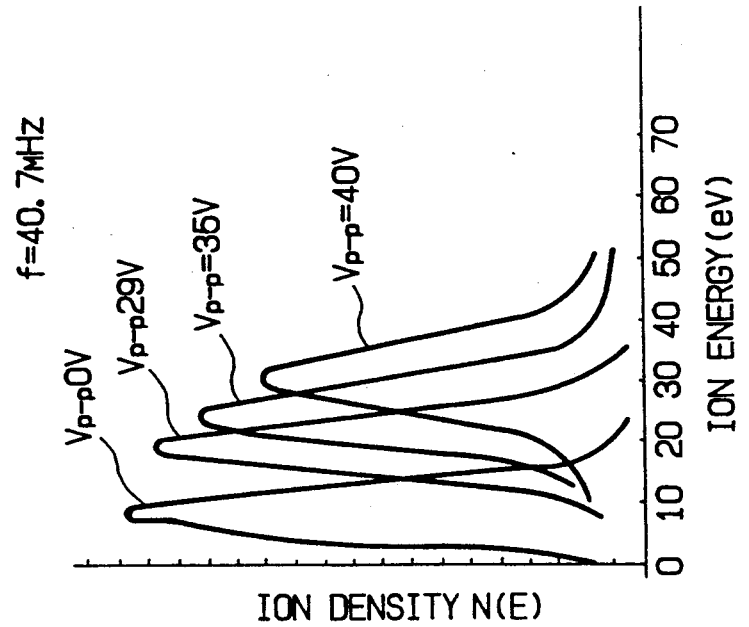
FIG. 2(E) and FIG. 2(F) are views respectively illustrating the ion energy profiles obtained in Experiment 2.
Figure 2F:
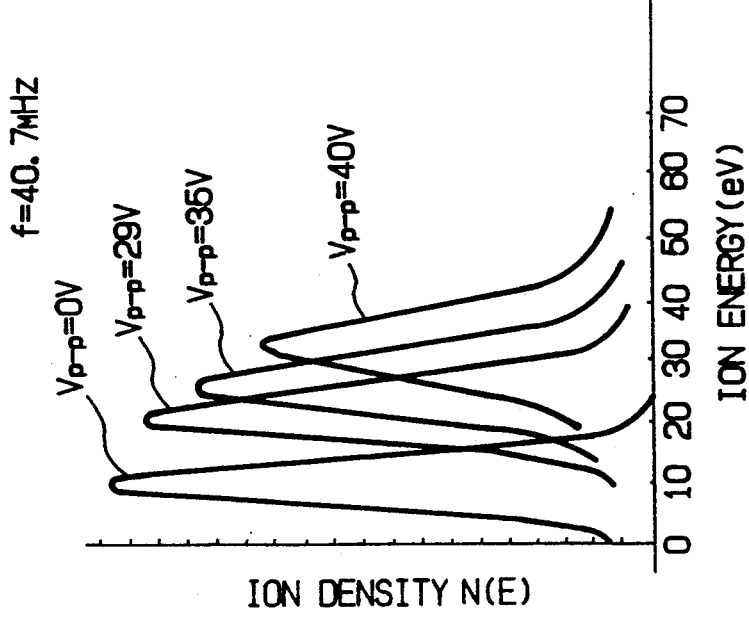

As apparent from the results shown in FIGS. 2(E) and 2(F), it has been recognized that with respect to the ion energy profiles, there is not found any distinguishable difference between the two cases.

In conclusion, from the results obtained in this experiment, there have been found the following facts: the direction of applying a high frequency voltage in order to control an ion energy in the case where a magnetic field exists is more effective when it is made perpendicular to the magnetic field; and when plasma is treated while controlling an ion energy, it is more desirable to place an article to be treated with plasma in the direction perpendicular to the magnetic field to be applied in the case of using the electro-magnet.

EXPERIMENT 3

In this experiment, there was observed about the situation that the effect by the application of a high frequency voltage will be markedly provided with which frequency in order to control the dispersion of an ion energy.

The procedures of Experiment 1 using the apparatus shown in FIG. 1(A) were repeated, except that the $V_{p-p}$ of the high frequency to be applied onto the ion energy controlling electrode 103 was made constant and the frequency was varied. And there was observed the interrelation between the ratio ($\Delta E_H/E_M$) of a half width [$\Delta E_H(eV)$] of an ion energy to a ion energy peak value [$\Delta E_M(eV)$] versus a frequency [f(MHz)] to be applied.

Figure 2G:
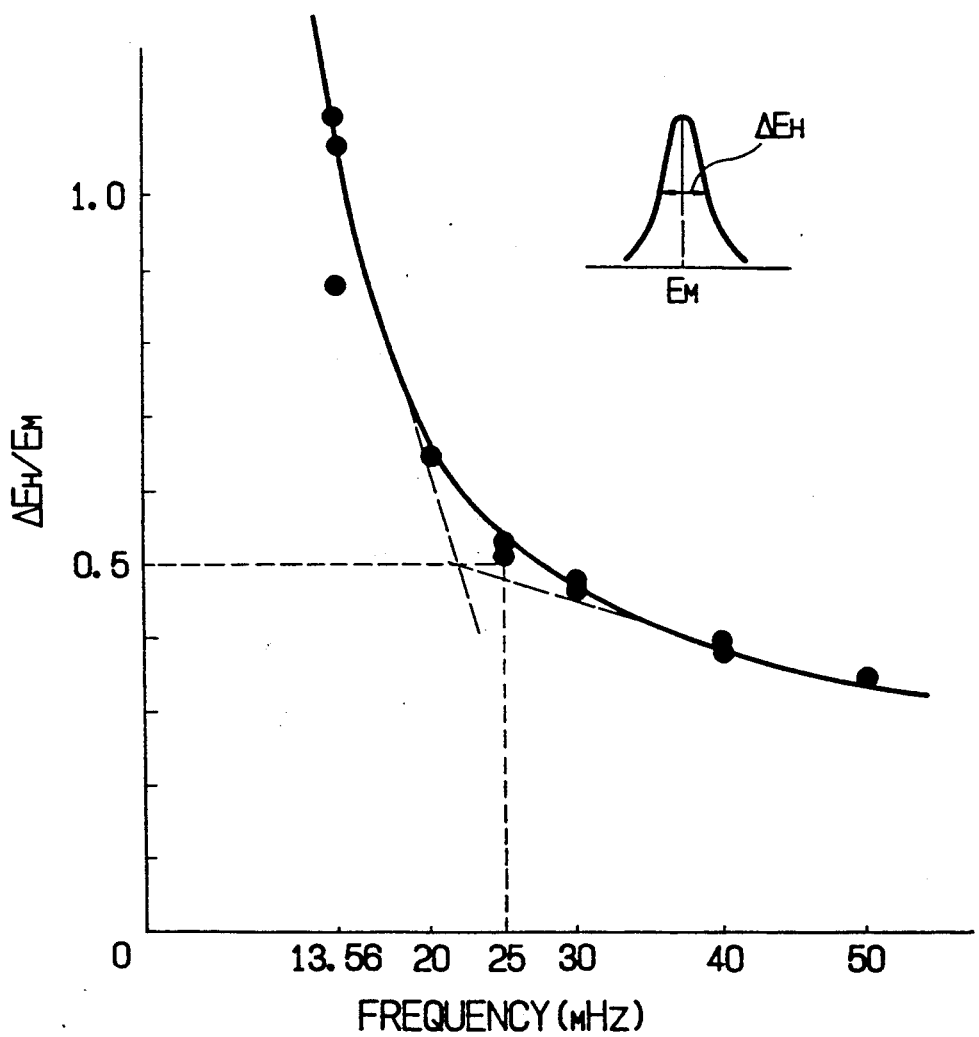
FIG. 2(G) is a graph illustrating the ratios between frequencies of the high frequency voltages applied and half widths of ion peak energies obtained in Experiment 3 of the present invention.

As a result, there were obtained the results shown in FIG. 2(G).

From what shown in FIG. 2(G), it has been recognized that the $\Delta E_H/E_M$ starts to reduce sharply from around 20 MHz for the frequency of the high frequency voltage to be applied and following this, the dispersion of an ion energy becomes smaller.

In view of this finding and in view of the results shown in FIG. 2(D) obtained in Experiment 1 wherein the ion energy peak obtained with the frequency of 20 MHz is not single in the case where the $V_{p-p}$ is made large, it has been recognized that in order to desirably decrease the dispersion of an ion energy to be supplied toward an insulating plate, it is desired to apply a high frequency voltage with a frequency of 25 MHz or more which satisfies the relation $\Delta E_H/E_M \leq 0.5$.

EXPERIMENT 4

In the case of forming a high quality deposited film on an insulating substrate by utilizing microwave discharge in a film-forming raw material gas, it is always required to stably maintain said microwave discharge in a desired state.

In this experiment, there was observed about the state of microwave discharge by using the apparatus shown in FIG. 1(A), wherein the frequency of a microwave used for the generation of plasma was made constant at 2.45 GHz and the value of a high frequency voltage to be applied was made constant, but the frequency of said high frequency voltage was varied as shown in Table 1.

The procedures of Experiment 1 were repeated except for using $H_2$ gas or a mixture of $H_2$ gas and Ar gas at the respective flow rates shown in Table 1 for each of the cases shown in Table 1.

For each case, there were examined discharge stability, reverse microwave power, minimum microwave power required for maintaining discharge, and sharpness of the ion energy profile.

The results obtained were as shown in Table 1.

As shown in Table 1, when the frequency of the high frequency voltage applied was close to 2.45 GHz of the microwave used, discharge became unstable and the profile of an ion energy could not be measured. It is considered that this happened because of the mutual interference between the microwave power and the high frequency power.

Now, there is a tendency that discharge in a film-forming gas such as $SiH_4$, etc. is maintained in a more stable state than that in the case of discharge in H₂ gas or Ar gas. In this connection, it can be said that when there is obtained a good result in the discharge test with respect to H₂ gas and Ar gas, the result is effective also in the case of using such film-forming raw material gas.

As a result of making studies on the results shown in Table 1 while taking the above situation into consideration, the following facts have been found that in the case of using a microwave power with a frequency of 2.45 GHz for the generation of plasma, the upper limit for the frequency of a high frequency voltage to be applied is desired to be such a frequency that does not have any negative influence one microwave discharge.

Specifically, it is desired to be preferably 500 MHz or less or more preferably, 100 MHz or less.

In conclusion as a result of the foregoing Experiments 1 to 4, it has been recognized that the frequency of the high frequency voltage to be applied to a conductive substrate holder having an insulating substrate thereon in order to control dispersion of an ion energy in plasma produced by decomposing H₂ gas. Ar gas or a mixture of them with the action of a microwave energy with a frequency of 2.45 GHz which is supplied toward the surface of said substrate is preferably in the range of from 20 to 500 MHz and more preferably in the range of from 25 to 100 MHz.

EXPERIMENTS 5 to 7

In the foregoing Experiments 1 to 4, there was used H₂ gas or Ar gas which is not causing deposition of a film on the ion collecting electrode in order to accurately observe the state of an ion energy.

In order to confirm the effectiveness of the results obtained in Experiments 1 to 4 in the case of forming a deposited film on an insulating plate (substrate) with the use of a film forming raw material gas such as SiH₄ gas, etc. by the MW-PCVD method, the following Experiments 5 to 7 were conducted.

EXPERIMENT 5

In this experiment, there was observed the interrelation between the frequency of a high frequency voltage applied and the crystallinity of a deposited silicon film formed by using SiH₄ gas as the film-forming raw material gas, causing discharge in the film-forming raw material gas with the use of a microwave energy with a frequency of 2.45 GHz to produce plasma in a plasma generation chamber and introducing said plasma into a film-forming chamber containing an insulating substrate positioned on a conductive substrate holder installed therein while applying a high frequency voltage with a predetermined frequency between the plasma generation chamber and the substrate holder to extract ions of the plasma toward the surface of the insulating substrate, whereby causing the formation of a deposited silicon film on the insulating substrate maintained at a desired temperature.

Figure 7:
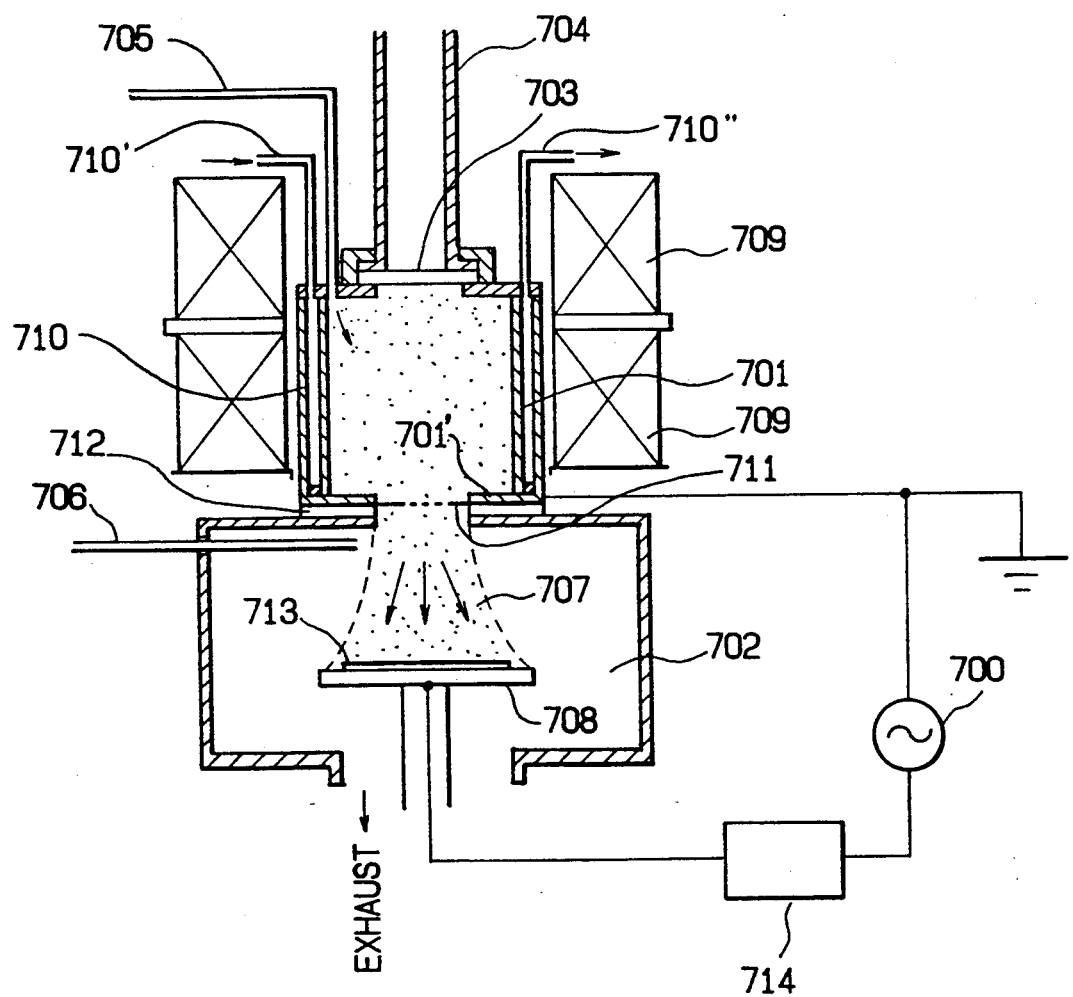
FIG. 7 is a cross-sectional view schematically illustrating an example of the apparatus comprising the film-forming chamber shown in FIG. 4 and the plasma generation chamber shown in FIG. 5(B) which is suitable for practicing the MW-PCVD process of the present invention.

In order to carry out the film-formation, there was used a MW-PCVD apparatus having the constitution shown in FIG. 7.

The apparatus shown in FIG. 7 comprises a plasma generation chamber 701 having a plasma generation space and a film-forming chamber 702 having a film-forming space. The plasma generation chamber 701 is connected through an insulating member 712 to the film-forming chamber 702 such that the plasma generation chamber 701 is electrically isolated from the film-forming chamber 702. The plasma generation space is directly connected through the hole formed at the center portion of the bottom wall of the plasma generation chamber 701 and the hole formed at the center portion of the upper wall of the film-forming chamber 702. With said hole of the bottom wall of the plasma generation chamber 701, there was provided a grid electrode 711 comprising a metal mesh member in a way of apparently sealing the plasma generation space. The upper wall of the plasma generation chamber 701 is hermetically provided with a microwave introducing window 703 formed of a dielectric material such as quartz connected to a waveguide 704 extending from a microwave power source (not shown).

Numeral reference 705 stands for a gas feed pipe extending from a gas reservoir (not shown) in which a raw material gas is contained. Numeral reference 710 stands for a cooling unit provided with the outer wall of the plasma generation chamber 701.

Numeral reference 710' stands for a pipe for supplying a cooling water into the cooling unit 710 and numeral reference 710'' stands for a pipe for recycling the cooling water from the cooling unit 710. Numeral reference 709 stands for an electro-magnet which is so provided as to surround the plasma generation chamber 701. The film-forming chamber 702 provided with an exhaust pipe connected through an exhaust valve (not shown) to a vacuum pump (not shown).

Numeral reference 706 stands for a gas feed pipe provided with the film-forming chamber 702.

The gas feed pipe 706 is extending from a gas reservoir (not shown) in which a raw material gas is contained. Numeral reference 707 stands for a stream of plasma supplied through the mesh grid electrode 711 from the plasma generation chamber 701. Numeral reference 708 stands for a substrate holder made of a conductive material having an electric heater (not shown) installed therein. Numeral reference 713 stands for an insulating substrate such as a glass plate, on which a film is to be formed, which is positioned on the substrate holder 708. Numeral reference 700 stands for a variable RF generator comprising a RF oscillator and an amplifier. The variable RF generator is electrically connected to the grid electrode 711. The variable RF generator is electrically connected through an impedance matching circuit 714 to the conductive substrate holder.

In the above apparatus, the electro-magnet 709 serves to effect a magnetic field in the plasma generation space upon causing microwave discharge to produce plasma when it is used, to thereby maintain said microwave discharge in a more stable state. The cooling unit 710 serves to prevent the electro-magnet 709 from being heated. Further in the apparatus, it is possible to supply a film-forming raw material gas through the gas feed pipe 705 into the plasma generation space. In alternative, it is possible to supply a plasma generating raw material gas through the gas feed pipe 705 into the plasma generation space and to supply a film-forming raw material gas through the gas feed pipe 706 into the film-forming space.

The film formation using the above apparatus in this experiment was carried out as follows.

As the insulating substrate 713, there was used a quartz glass plate. Firstly, said quartz glass plate was positioned on the conductive substrate holder 708. The electric heater installed in the substrate holder was actuated to heat the quartz glass plate to 400° C. and it was maintained at this temperature.

At the same time, the plasma generation chamber 701 and the film-forming chamber 702 were evacuated to a vacuum of about $1\times10^{-7}$ Torr by actuating the vacuum pump (not shown). Then SiH$_4$ gas was introduced through the gas feed pipe 705 into the plasma generation space at a flow rate of 4 sccm. The gas pressure in the film-forming space was controlled to about $3\times10^{-5}$ Torr by regulating the exhaust valve (not shown). The electro-magnet 709 was actuated to effect a magnetic field in the plasma generation space. At the same time, the microwave power source was switched on to apply a microwave power of 300 W (2.45 GHz) into the plasma generation space. Concurrently, the RF generator 700 was switched on to apply a predetermined high frequency voltage with a predetermined frequency between the grid electrode 711 and the conductive substrate holder 708. In this way, microwave discharge in SiH$_4$ gas was caused to produce plasma in the plasma generation space and the resultant plasma was successively introduced into the film-forming space to cause the formation of a deposited silicon film on the quartz glass plate maintained at 400° C. Thus, there were obtained a plurality of deposited silicon film samples with the application of a high frequency voltage of 0 to 600 V with a frequency of 13.56 MHz, 40 MHz and 100 MHz. For each of the resultant deposited silicon film samples, the crystallinity was examined by RHEED (Reflective High Energy Electron Diffraction). The examination by RHEED was conducted by using a commercially available JEM-100 SX Type Electron Microscope (product by JEOL Ltd.). The results obtained were qualitatively shown in FIG. 3(A). As illustrated in FIG. 3, the crystallinity of each deposited silicon film sample was examined based on the RHEED pattern obtained of whether the film is amorphous, polycrystalline or single crystalline depending upon the situation of the film belonging to which pattern among halo, ring, spot and streak patterns.

Thus, the evaluation of each of the resultant deposited silicon films based on the RHEED pattern was conducted with 10 classified standards previously established between the halo pattern and the streak pattern.

The mark "o" in FIG. 3(A) is for the comparative deposited silicon film sample prepared by the foregoing MW-PCVD method using a D.C. voltage.

From the results shown in FIG. 3(A), it has been found that the film to be formed on an insulating substrate by applying a high frequency voltage to the conductive substrate holder having said substrate thereon during its formation by the MW-PCVD method has a tendency of being crystallized more easily in comparison with the film to be formed by applying a D.C. voltage and said tendency becomes significant in the case where a high frequency voltage with a high frequency is used. It has been also found that when a high frequency voltage of an excessively high value is applied, the crystallinity of a deposited silicon film to be formed has a tendency of being reduced, and the high frequency voltage to be applied in order to form a desirable deposited silicon film having a good crystallinity on an insulating substrate is desired to be in the range of from 100 to 500 V in general.

EXPERIMENT 6

In this experiment, there was observed the situation of how the inner pressure influenced the crystallinity of a deposited film to be formed on an insulating substrate positioned on the conductive substrate holder by the MW-PCVD method while applying a high frequency voltage to said conductive substrate holder.

There were prepared a plurality of deposited silicon film samples by repeating the procedures of Example 5 except that the high frequency voltage of 200 V with a frequency of 13.56 MHz, 40 MHz or 100 MHz was used and the inner pressure of the film-forming chamber was varied.

For each of the resultant deposited silicon film samples, its crystallinity was examined in the same manner as in Example 5.

The results obtained were qualitatively shown in FIG. 3(B).

As shown in FIG. 3(B), there has been found a fact that the film to be formed on an insulating substrate positioned on the conductive substrate holder under the conditions of $5\times10^{-3}$ Torr or less for the inner pressure of the film-forming chamber by the MW-PCVD method while applying a high frequency voltage to the conductive substrate holder has a tendency of being easily crystallized and this tendency becomes more significant in the case where a high frequency voltage with an increased frequency is used. In this experiment, the film formation was not conducted with the inner pressure of less than $10^{-6}$ Torr due to that microwave discharge was hardly caused with such inner pressure because of the excessively small gas density.

EXPERIMENT 7

In this experiment, there was observed the situation of how the substrate temperature influenced the crystallinity of a deposited film to be formed on an insulating substrate positioned on the conductive substrate holder by the MW-PCVD method while applying a high frequency voltage to said conductive substrate holder.

There were prepared a plurality of deposited silicon film samples by repeating the procedures of Example 5, except that a high frequency voltage of 200 V with a frequency of 40 MHz and a high frequency voltage of 300 V with a frequency of 40 MHz were used, and the substrate temperature was varied in the range of from 100° to 600° C.

Each of the resultant deposited silicon film samples was examined with respect its crystallinity in the same manner as in Example 5. The results obtained were qualitatively shown in FIG. 3(C).

Further, each of the deposited silicon film samples obtained with the application of a high frequency voltage of 300 V with a frequency of 40 MHz at a substrate temperature in the range of 200° to 600° C. was examined with respect to the average size of grains contained in the film. Each deposited film sample was subjected to X-ray diffraction and the average grain size was obtained by the Sherrer's equation.

Figure 3D:
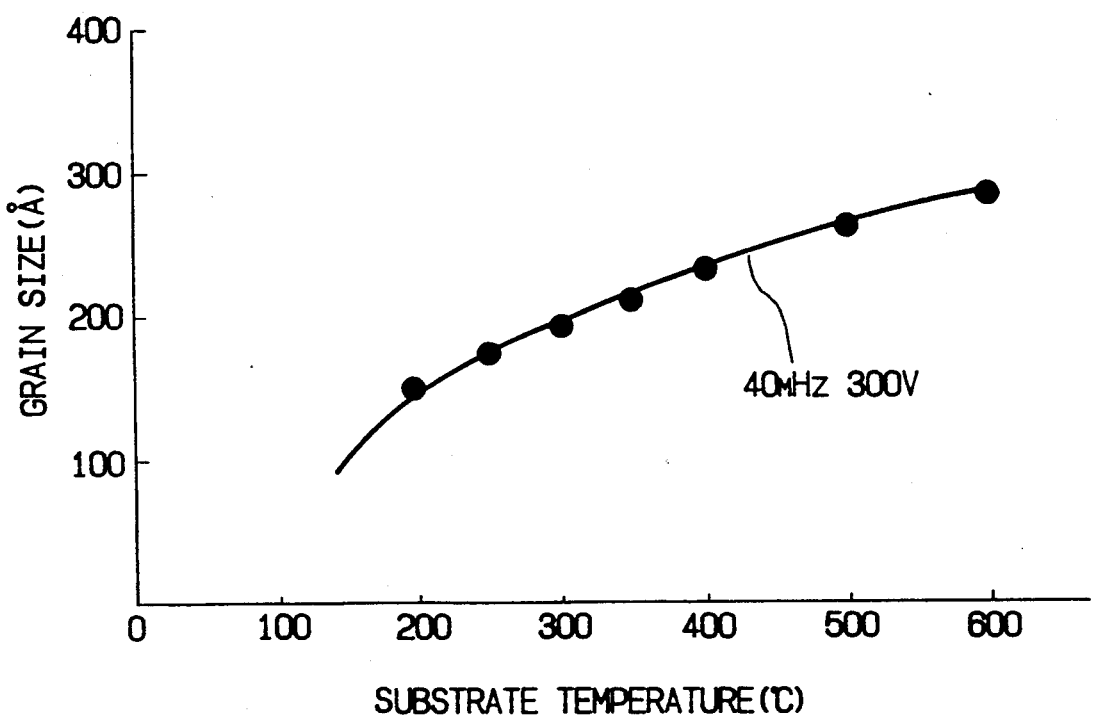
FIG. 3(D) is a view illustrating the interrelations between the substrate temperatures at the time of film formation and the grain sizes of the deposited films which were obtained in Experiment 7.

The results obtained were shown in FIG. 3(D).

From the results shown in FIGS. 3(C) and 3(D), there has been found a fact that the film to be formed on an insulating substrate positioned on the conductive substrate holder at a deposition temperature (substrate temperature) in the range of from 200° to 400° C. by the MW-PCVD method while applying a high frequency voltage has a tendency of being easily crystallized.

And it has been found that those deposited silicon films are satisfactory in view of the average grain size.

The present inventors have made studies based on the findings obtained in the foregoing experiments and as a result, have found the following fact.

It is possible to stably and repeatedly form a high quality polycrystalline semiconductor film even on an insulating at a low deposition temperature by the MW-PCVD method in the case where microwave discharge is caused in a raw material gas in a plasma generation chamber and the resulting plasma is successively introduced into a film-forming chamber containing said insulating substrate positioned on a conductive substrate holder installed therein while applying a high frequency voltage of 100 to 500 V with a frequency of 20 to 500 MHz between the plasma generation chamber and the conductive substrate holder and while maintaining the inner pressure of the film-forming chamber at a vacuum in the range of from $1 \times 10^{-6}$ to $5 \times 10^{-3}$ Torr and maintaining the insulating substrate at a temperature in the range of from 200° to 400° C. In this case, there is formed a desirable profile of ion energy in the vicinity of the surface of the insulating substrate and desirable film-forming chemical reactions are caused there. As a result, there is formed a desirable high quality polycrystalline semiconductor film on an insulating substrate.

The present inventors have found a further fact that when a magnetic field is effected in the plasma generation chamber in the above case, the microwave discharge is more stabilized and the foregoing high quality polycrystalline semiconductor film is more effectively formed on an insulating substrate.

The present invention has been accomplished based on the above findings and it provides an improved MW-PCVD process for forming a high quality polycrystalline semiconductor film on an insulating substrate at a low deposition temperature.

The gist of the MW-PCVD process according to the present invention comprises using a MW-PCVD apparatus comprising a plasma generation chamber provided with a microwave introducing means and a film-forming chamber connected through a grid electrode to said plasma generation chamber, said film-forming chamber containing an insulating substrate positioned on a substrate holder made of a conductive material being installed therein, said film-forming chamber being electrically isolated from the plasma generation chamber, producing plasma by contacting a film-forming raw material gas with a microwave energy applied by said microwave introducing means to decompose said film-forming raw material gas in said plasma generation chamber and introducing said plasma into said film-forming chamber while applying a high frequency voltage of 100 to 500 V with a frequency preferably in the range of from 20 to 500 MHz or more preferably in the range of from 25 to 100 MHz to thereby form a polycrystalline semiconductor film on said insulating substrate maintained at a desired temperature.

In the MW-PCVD process of the present invention, it is desired for the insulating substrate to be arranged in the direction perpendicular to the direction of an electric field formed by the application of a high frequency voltage. In this case, there is provided a most desirable effect by the application of a high frequency voltage.

Further in the MW-PCVD process of the present invention, it is possible to apply a magnetic field into the plasma generation chamber upon production of plasma therein. In this case, microwave discharge causing plasma in the plasma generation chamber is more stabilized in a desirable state and as a result, a desirable high quality polycrystalline semiconductor film is further effectively formed on the insulating substrate.

As for the inner pressure of the film-forming chamber upon formation of the polycrystalline semiconductor film by the MW-PCVD process of the present invention, it is desired to be preferably in the range of from $1 \times 10^{-4}$ to $5 \times 10^{-3}$ Torr in the case where a magnetic field is not applied. In the case where a magnetic field is applied, it is desired to be preferably in the range of from $1 \times 10^{-6}$ to $5 \times 10^{-3}$.

As for the substrate temperature upon formation of the polycrystalline semiconductor film by the MW-PCVD process of the present invention, it is desired to be preferably in the range of from 200° to 400° C. and more preferably, in the range of from 250° to 350° C.

According to the present invention, it is possible to form various polycrystalline semiconductor films on a commercially available inexpensive substrate such as soda-lime glass, synthetic resin films.

As such polycrystalline semiconductor films, there can be mentioned polycrystalline semiconductor films of Group IV elements of the Periodic Table (hereinafter referred to as "Group IV polycrystalline semiconductor film"), polycrystalline semiconductor films of Group II and VI elements (hereinafter referred to as "Group II-VI polycrystalline semiconductor film") and polycrystalline semiconductor films of Group III and V elements (hereinafter referred to as "Group III-V polycrystalline semiconductor film").

Specific examples of the Group IV semiconductor film are poly-Si semiconductor film, poly-Ge semiconductor film, poly-SiGe semiconductor film, poly-SiC semiconductor film, etc.

Specific examples of the Group II-VI semiconductor film are poly-ZnO semiconductor film, poly-ZnS semiconductor film, poly-ZnSe semiconductor film, poly-CdS semiconductor film, poly-CdSe semiconductor film, etc.

Specific examples of the Group III-V semiconductor film are poly-AlAs semiconductor film, poly-AlSb semiconductor film, poly-GaN semiconductor film, poly-GaP semiconductor film, poly-GaSb semiconductor film, poly-InP semiconductor film, poly-InAs semiconductor film, poly-InSb semiconductor film, etc.

As for the insulating substrate to be used for forming any of those polycrystalline semiconductor films in the present invention, there can be used any of known non-single crystal substrates.

Examples of such substrate are quartz glass, soda-lime glass, alumina glass, boron nitride glass, and synthetic resin films such as polyimide film, silicon resin film, etc.

As the film-forming raw material to be used for forming any of the foregoing crystalline semiconductor films in the present invention, any of the known compounds which are in gaseous state at normal temperature and atmospheric pressure or can be easily gasified.

In the case of using a compound which is not in gaseous state at normal temperature and at atmospheric pressure, it is subjected to heat treatment in a furnace or subjected to bubbling to generate a raw material gas, which is followed by introducing into the plasma generation chamber or into the film-forming chamber. Other than the film-forming raw material gas, it is possible to use one or more gases selected from the group consisting of $H_2$, Ar, He, Ne, Kr, Xe, $F_2$, $Cl_2$, HF and HCl in order to stabilize microwave discharge or to promote film-forming chemical reaction.

Specifically, usable as the film-forming raw material for the formation of the Group IV polycrystalline semiconductor film are, for example, Si-containing compounds such as $SiH_4$, $Si_2H_6$, $SiH_4$, $SiHF_3$, $SiH_2F_2$, $SiH_3F$, $Si_2F_6$, $SiCl_4$, $SiH_2Cl_2$, $SiH_3Cl$, etc., Ge-containing compounds such as $GeH_4$, $GeF_4$, etc. and C-containing compounds such as $CH_4$, $C_2H_2$, $C_2H_4$, $C_2H_6$, etc.

Usable as the Group II element-containing raw material for the formation of the Group II–VI polycrystalline semiconductor film are, for example, Zn-containing compounds such as $Zn(CH_3)_2$, $Zn(C_2H_5)_2$, etc. and Cd-containing compounds such as $Cd(CH_3)_2$, $Cd(C_2H_5)_2$, etc.

Likewise, usable as the Group VI element-containing raw material for the formation of the Group II–VI polycrystalline semiconductor film are, for example, S-containing compounds such as $H_2S$, $S(CH_3)_2$, $S(C_2H_5)_2$, $S(CH_3)(C_2H_5)$, etc., and Se-containing compounds such as $H_2Se$, $Se(CH_3)_2$, etc.

Usable as the Group III element-containing raw material for the formation of the Group III–V polycrystalline semiconductor film are, for example, Al-containing compounds such as $Al(CH_3)_3$, $Al(C_2H_5)_3$, $Al(C_4H_9)_3$, etc., Ga-containing compounds such as $Ga(CH_3)_3$, $Ga(C_2H_5)_3$, etc., and $In(CH_3)_3$.

The MW-PCVD process for forming the foregoing polycrystalline semiconductor film on an insulating substrate according to the present invention may be practiced in an appropriate MW-PCVD apparatus. As such apparatus, there can be mentioned those MW-PCVD apparatus comprising a film-forming chamber having the constitution shown in FIG. 4 and a plasma generation chamber having the constitution shown in one of FIGS. 5(A) to 5(G).

Figure 8A:
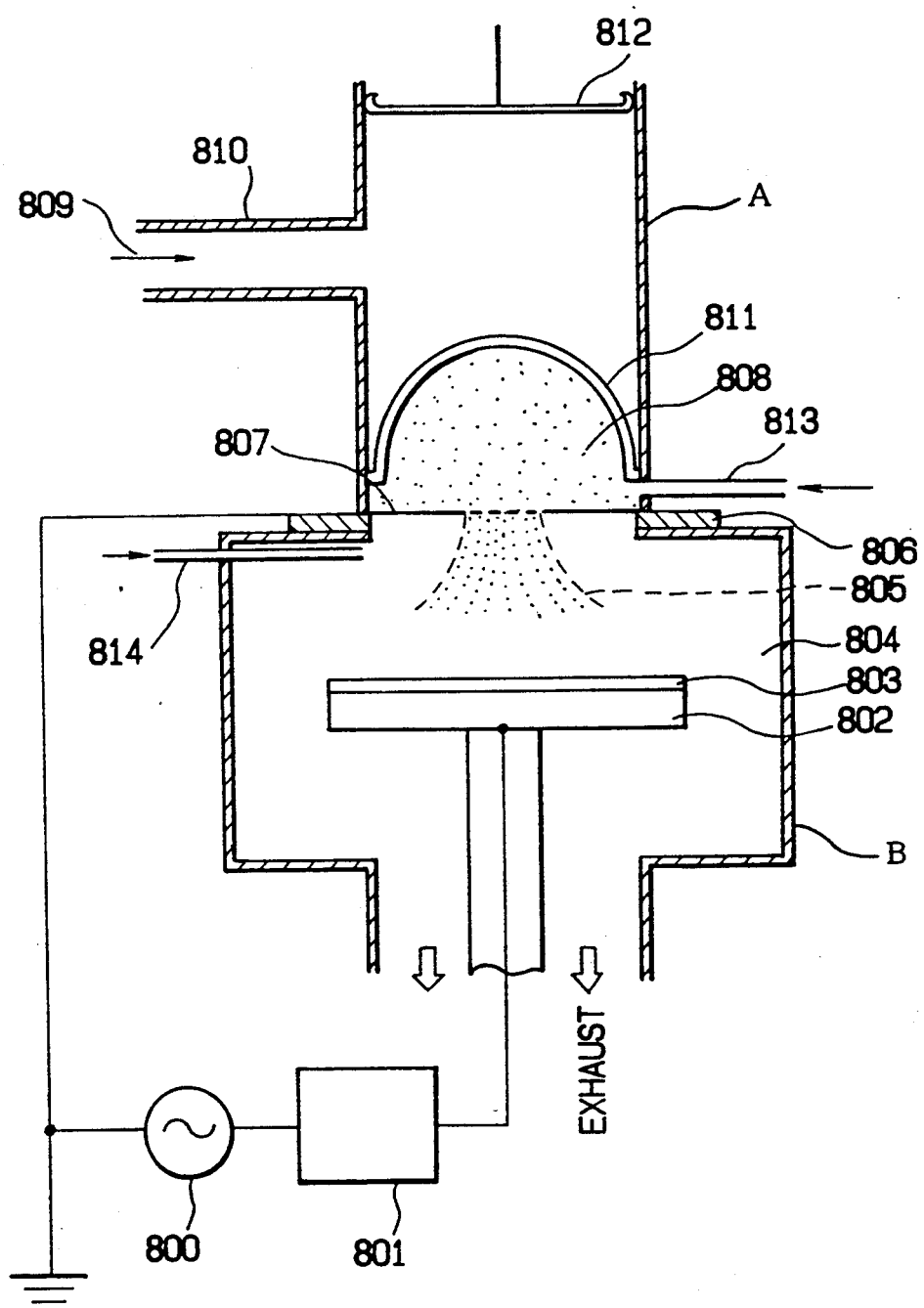
FIG. 8(A) is a cross-sectional view schematically illustrating an example of the apparatus comprising the film-forming chamber shown in FIG. 4 and the plasma generation chamber shown in FIG. 5(C) which is suitable for practicing the MW-PCVD process of the present invention.

Specific examples are those shown in FIG. 7, FIG. 8(A) and FIG. 8(B).

Figure 4:
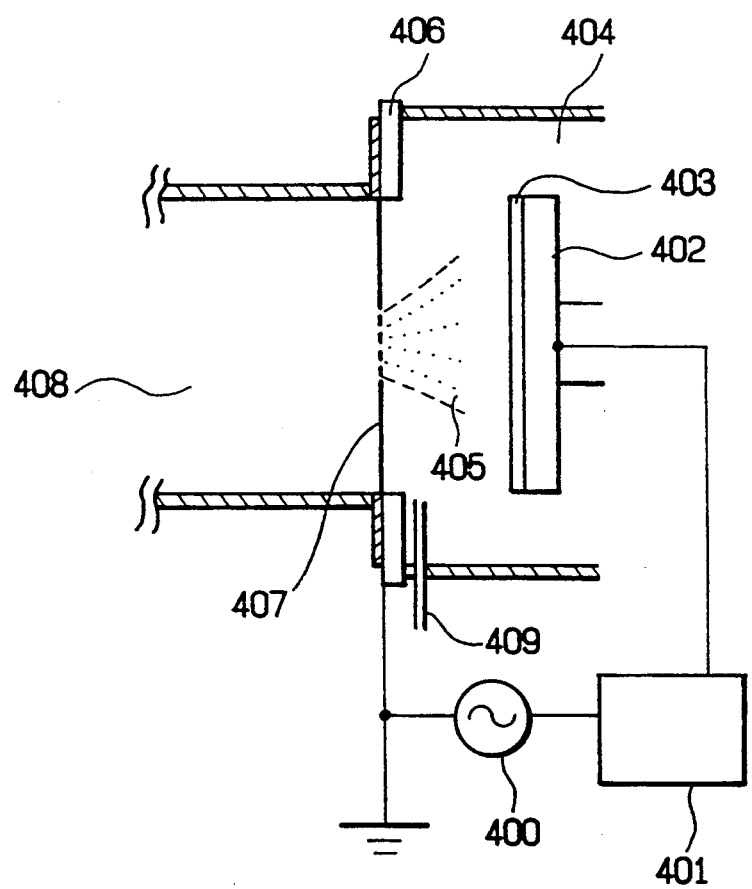
FIG. 4 is a cross-sectional portion view schematically illustrating an example of the constitution of the film-forming chamber to which a plasma generation chamber is to be connected through a grid electrode which is suitable for practicing the MW-PCVD process of the present invention.

FIG. 4 schematically shows a representative basic constitution of the film-forming chamber.

Referring to FIG. 4, numeral reference 402 stands for a substrate holder made of a conductive material which is installed in a film-forming chamber 404. Numeral reference 403 stands for an insulating substrate positioned on the conductive substrate holder. Numeral reference 408 stands for a plasma generation chamber being connected through an insulating member to the film-forming chamber 404. Numeral reference 407 stands for a grid electrode comprising a conductive metal mesh member which is so provided as to apparently seal the plasma generation chamber 408. Numeral reference 400 stands for a variable RF generator comprising a RF oscillator and an amplifier. The variable RF generator 400 is electrically connected to the grid electrode. The variable RF generator 400 is electrically connected through an impedance matching circuit 401 to the conductive substrate holder 402. Numeral reference 409 stands for a gas feed pipe extending from a gas reservoir (not shown).

FIG. 5(A) through FIG. 5(G) are schematic views for illustrating representative examples of the basic constitution of the plasma generation chamber.

In FIGS. 5(A) to 5(G), numeral reference 500 stands for a microwave. Numeral reference 501 is a waveguide; numeral reference 502 is a plasma generation chamber; numeral reference 503 is a microwave introducing window; numeral reference 504 is a magnet; numeral reference 505 is a grid electrode (or earth electrode); numeral reference 506 is a Lisitano coil; numeral reference 507 is a helical antenna; numeral reference 508 is a coaxial rod antenna; numeral reference 509 is a leaky-wave antenna; numeral reference 510 is a variable plunger of a cavity resonator; and numeral reference is a gas feed pipe.

Figure 5A:
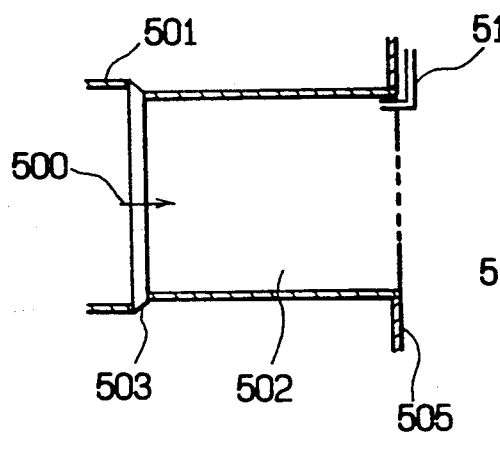
FIG. 5(A) through FIG. 5(G) are cross-sectional views respectively illustrating an example of the constitution of the plasma generation chamber to be connected to the film-forming chamber shown in FIG. 4.

The constitution of FIG. 5(A) is of the type that discharge in a raw material gas is caused by directly introducing a microwave through the microwave introducing window 503 made of a dielectric material into the plasma generation chamber having a cavity resonator structure.

Figure 5C:
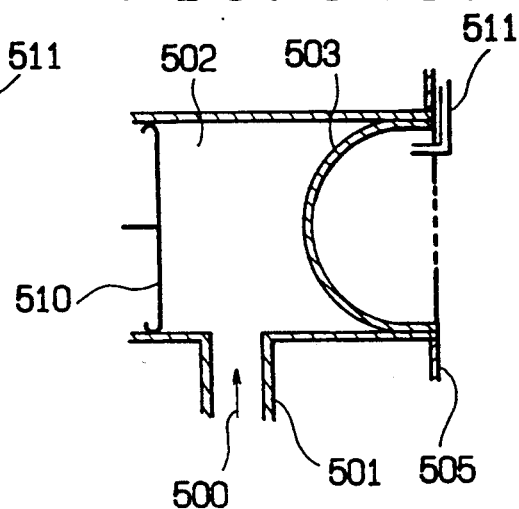
Figure 5B:
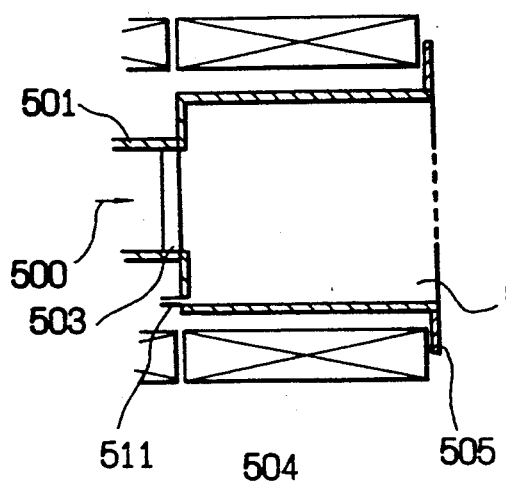

The constitution of FIG. 5(B) is of a nonpolar discharging ECR system in which the plasma generation chamber 502 has a cavity resonator structure.

The constitution of FIG. 5(C) is of the type that discharge in a raw material gas is caused while matching the impedance by varying the axis length of the cavity resonator of the plasma generation chamber 502 with the use of the variable plunger 510.

Figure 5D:
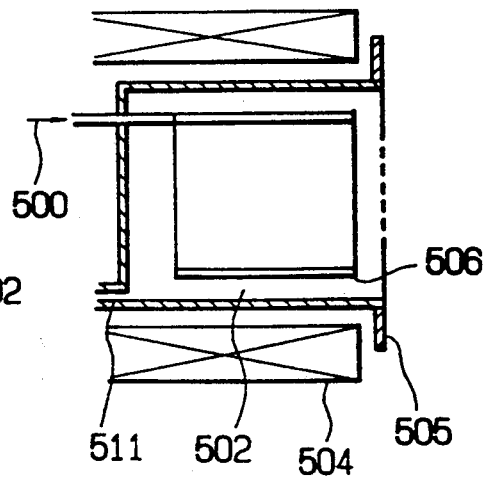

The constitution of FIG. 5(D) is of a ECR plasma generation system with the use of the Lisitano coil 506.

Figure 5E:
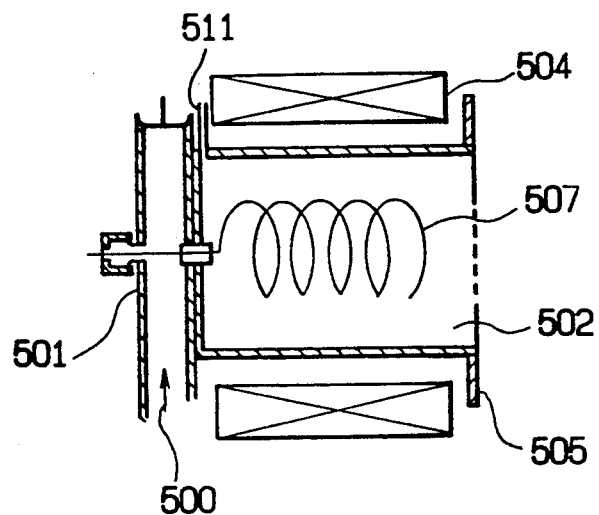

The constitution of FIG. 5(E) is of a ECR plasma generation system in which a microwave is introduced by the helical antenna 507.

Figure 5G:
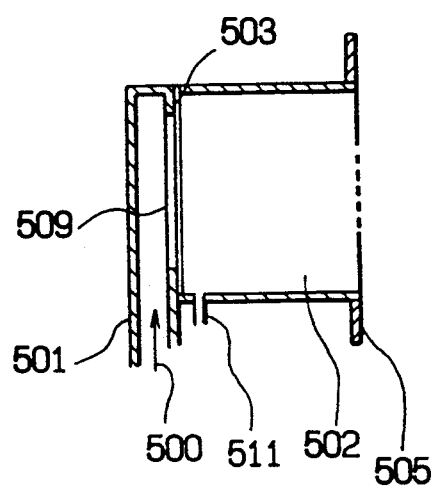
Figure 5F:
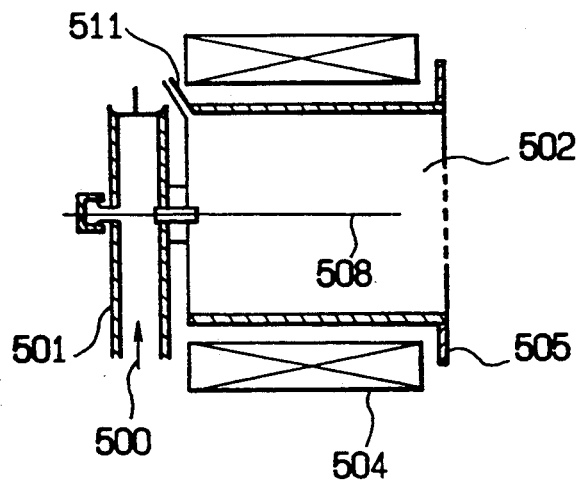

The constitution of FIG. 5(F) is of a ECR plasma generation system in which a microwave is introduced by the coaxial rod antenna 508.

The constitution of FIG. 5(G) is of the type that discharge in a raw material gas is caused by the introduction of a microwave through the leaky-wave antenna 509.

In any of the above cases, the principal constitution of the plasma generation chamber 502 comprises a microwave introducing means and a raw material gas supply means. The foregoing constitutions for the plasma generation chamber 502 can be classified into two types with respect to plasma generation system: one is of the nonpolar discharging and the other is of the antenna type.

In any of the cases of FIGS. 5(A) to 5(C), plasma is generated by way of nonpolar discharge and there is an advantage that plasma as produced is not contaminated with foreign matters. Because of this, these constitutions are suitable for the case of decomposing a large amount of a raw material gas with the application of a large microwave power to produce a large amount of plasma. For the remaining cases of FIGS. 5(D) to 5(G), they are not suitable for applying a large microwave power but any of them has an advantage that discharge is stably caused.

In order to more stably cause microwave discharge in a raw material gas and to more effectively produce plasma with a high density, it is possible for the plasma generation to be provided with a means for applying a magnetic field into the plasma generation chamber in such a way as shown in FIG. 5(B), FIG. 5(D), FIG. 5(E) or FIG. 5(F). In the case of applying a magnetic field into the plasma generation chamber, the intensity of said magnetic field to be applied is preferably in the range of from 200 to 2000 Gauss and more preferably in the range of from 600 to 100 Gauss. In this case, it is desired to establish a region of the magnetic field intensity capable of causing an electron cyclotron resonance in the plasma generation chamber in view of effectively utilizing a microwave energy.

The plasma generation chamber may be comprised of any of the above constitutions depending upon the situation.

The apparatus shown in FIG. 7 is a representative MW-PCVD apparatus suitable for practicing the MW-PCVD process of the present invention which has the constitution of FIG. 4 for the film-forming chamber and the constitution of FIG. 5(B) for the plasma generation chamber.

The apparatus shown in FIG. 8(A) is another representative MW-PCVD apparatus suitable for practicing the MW-PCVD process of the present invention which has the constitution of FIG. 4 for the film-forming chamber and the constitution of FIG. 5(C) for the plasma generation chamber.

The apparatus shown in FIG. 8(B) is a further representative MW-PCVD apparatus suitable for practicing the MW-PCVD process of the present invention which is a partial modification of the apparatus shown in FIG. 8(A) and has the same constitution as that of the former apparatus except that the conductive substrate holder is arranged in parallel to the direction of the stream of plasma in the film-forming chamber.

Explanation on the MW-PCVD apparatus shown in FIG. 7 is omitted here since it was used in each of the foregoing Experiments 5 to 7 and detailed explanation was made in the foregoing Experiment 5.

Therefore, explanation is to be made only about the MW-PCVD apparatus shown in FIGS. 8(A) and 8(B). Each of the MW-PCVD apparatus shown in FIGS. 8(A) and 8(B) comprises a plasma generation chamber A having a cavity resonator structure and a film-forming chamber B connected through an insulating member 806 to the plasma generation chamber A.

Thus, the film-forming chamber B is electrically isolated from the plasma generation chamber A by the insulating member 806. Numeral reference 802 stands for a substrate holder 802 made of a conductive material in which an electric heater (not shown) for heating an insulating substrate 803 positioned on the surface of said substrate holder is installed.

The film-forming chamber B is provided with an exhaust pipe being connected through an exhaust valve (not shown) to an vacuum pump (not shown). The film-forming chamber B is provided with a gas feed pipe extending from a gas reservoir in which a raw material gas is contained. Numeral reference 800 stands for a variable RF generator comprising a RF oscillator and an amplifier. The RF generator 800 is electrically connected through an impedance matching circuit 801 to the conductive substrate holder 802. The RF generator 800 is electrically connected also to a grid electrode (or earth electrode) 807 comprising a metal mesh member which is provided to the end portion of the plasma generation chamber A. Numeral reference 811 stands for a bell jar made of quartz which is so provided as to form a plasma generation space 808 with the grid electrode 807. Numeral reference 813 stands for a gas feed pipe to supply a raw material gas into the plasma generation space 808. The plasma generation chamber is provided with a waveguide 810 extending from a microwave power source (not shown) which serves to introduce a microwave 809 into the plasma generation chamber A. Numeral reference 812 stands for a variable plunger capable of changing the axis length of the cavity resonator. In the cavity resonator structure of the plasma generation chamber A, a microwave is introduced through the waveguide 810 and through the bell jar 811 into the plasma generation space 808 while adjusting the length of the cavity resonator by the plunger 812 and contacted with the raw material gas supplied there to produce plasma, which is followed by supplying into the film-forming chamber through the grid electrode 807 in a state shown by the numeral reference 805 while applying a high frequency voltage by the RF generator, to thereby cause the formation of a polycrystalline semiconductor film on the insulating substrate 803 maintained at a desired temperature.

In the case of practicing the MW-PCVD process of the present invention by one of the foregoing MW-PCVD apparatus, when a film-forming raw material gas which is not easily decomposed is used, it is desired to directly supply such film-forming raw material gas into the plasma generation chamber. In alternative, it is possible to supply a plasma generating raw material gas into the plasma generation chamber and to supply a film-forming raw material gas into the film-forming chamber. These two methods may be selectively employed depending upon the kind of the film-forming raw material gas used or other conditions. The latter method is effective particularly in the case of using a film-forming raw material gas capable of being easily decomposed with a heat energy.

In the present invention, it is possible to supply a heat energy or a light energy to the surface of the insulating substrate in order to further promote film-forming chemical reactions during film formation.

DESCRIPTION OF THE PREFERRED EMBODIMENTS

The present invention will be described more specifically while referring to Examples, but the invention is not intended to limit the scope only to these examples.

EXAMPLE 1

There was formed a polycrystalline silicon semiconductor film on an insulating substrate using the MW-PCVD apparatus shown in FIG. 7 in the same manner as in Experiment 5.

As the insulating substrate, there was used a Corning No. 7059 glass plate (product of Corning Glass Works).

Said glass plate was placed on the surface of the conductive substrate holder 708, and it was heated to 300° C. and maintained at this temperature. The plasma generation chamber 701 and the film-forming chamber 702 were evacuated to a vacuum of about $2 \times 10^{-7}$ Torr by actuating the vacuum pump (not shown). $H_2$ gas and $SiH_4$ gas were introduced through the gas feed pipe 705 into the plasma generation chamber 701 at respective flow rates of 50 sccm and 5 sccm. The inner pressure of the film-forming chamber 702 was controlled to and maintained at a vacuum of about $2 \times 10^{-5}$ Torr. Then, the electro-magnet 709 was actuated to apply a magnetic field of 875 Gauss, and at the same time, the microwave power source was switched on to apply a microwave power of 300 W through the microwave introducing window 703 into the plasma generation chamber 701. Concurrently the RF generator 700 was switched on to apply a high frequency voltage of 300 V with a frequency of 100 MHz to the conductive substrate holder 708 through the impedance matching circuit 714. Thus, film formation was carried out. As a result, a 2.5 μm thick polycrystalline silicon film was formed on the glass plate with a deposition rate of 1.5 Å/sec.

The crystallinity of the resultant film was examined by RHEED. And, an electrode was disposed on the surface of the resultant film by the vacuum evaporation, and a Hall effect thereof was examined by the Van der Pauw method. The film had a spot pattern in RHEED showing superiority in the crystallinity and provided a Hall mobility of 64 $cm^2/V \cdot sec$. in the examination of the Hall effect.

As a result, it was found that the resultant film was a high quality polycrystalline silicon semiconductor film.

COMPARATIVE EXAMPLE 1

Figure 6:
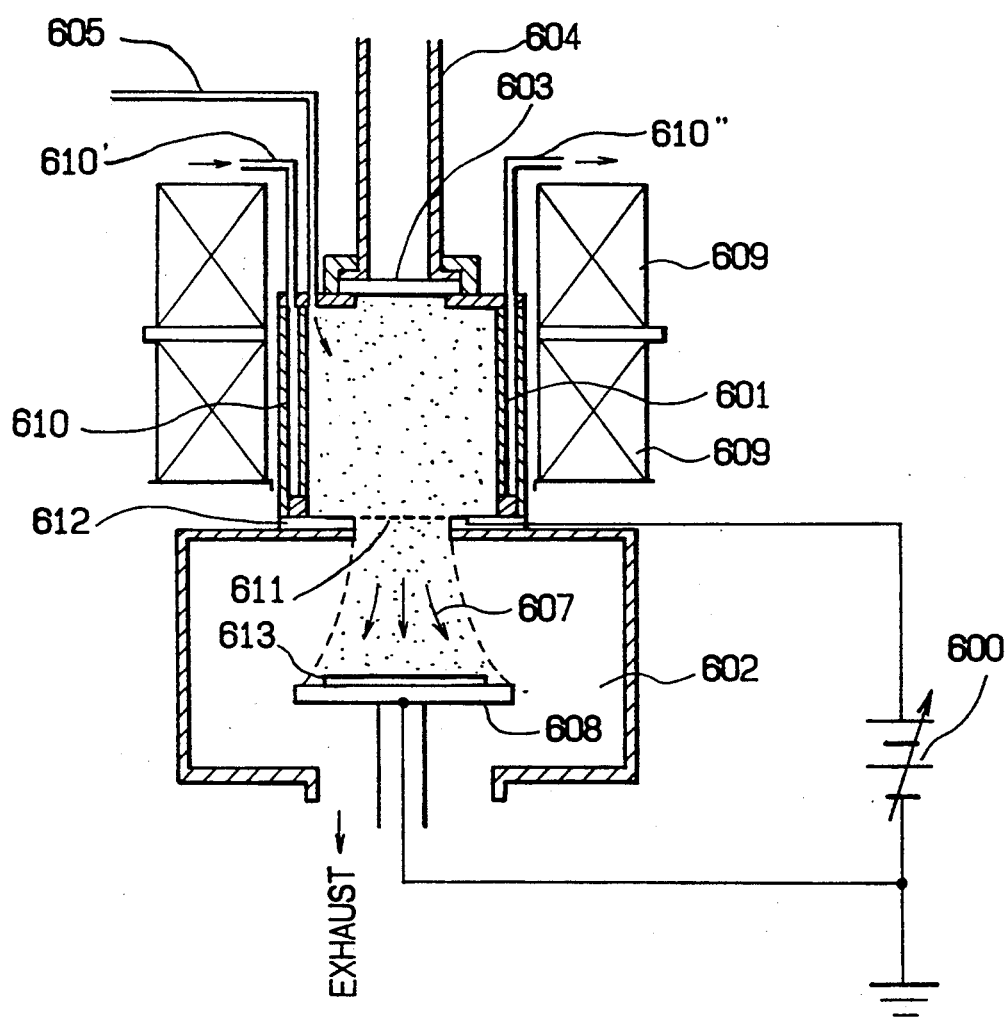
FIG. 6 is a cross-sectional view schematically illustrating the constitution of the known RIBD apparatus.

The foregoing film-forming procedures with the use of the apparatus shown in FIG. 6 were repeated wherein $H_2$ gas and $SiH_4$ gas were used at respective flow rates of 50 sccm and 5 sccm and a D.C. voltage of $-400$ V was applied, to thereby form a 1.8 μm thick deposited film on a Corning No. 7059 glass plate with a deposition rate of 13 A/sec.

The resultant film was examined in the same manner as in Example 1. As a result, it had a ring pattern in RHEED showing inferiority in the crystallinity and it provided a Hall mobility of 4 $cm^2/V.sec$.

It has been found that the resultant film was a practically unacceptable polycrystalline silicon film.

EXAMPLE 2

The procedures of Example 1 were repeated, except that the inner pressure of the film-forming chamber was changed to $2 \times 10^{-3}$ Torr, to thereby form a 2.5 μm thick polycrystalline silicon film on a Corning No. 7059 glass plate with a deposition rate of 17 A/sec.

The resultant film was examined in the same manner as in Example 1. As a result, it had a spot pattern in RHEED showing superiority in the crystallinity and provided a Hall mobility of 56 $cm^2/V.sec$.

It was found that the resultant film was a high equality polycrystalline silicon semiconductor film.

EXAMPLE 3

The procedures of Example 1 were repeated, except that the electro-magnet was not used, to thereby form a 2.5 μm thick polycrystalline silicon film on a Corning No. 7059 glass plate with a deposition rate of 11 A/sec.

The resultant film was examined in the same manner as in Example 1. As a result, it had a spot pattern in RHEED showing superiority in the crystallinity and provided a Hall mobility of 43 $cm^2/V.sec$.

It was found that the resultant film was a high quality polycrystalline silicon semiconductor film.

COMPARATIVE EXAMPLE 2

The procedures of Example 1 were repeated, except that the high frequency voltage to be applied was changed to a high frequency voltage of 400 V with a frequency of 13.56 MHz, to thereby form a 1.6 μm thick deposited film on a Corning No. 7059 glass plate with a deposition rate of 11 A/sec.

The resultant film was examined in the same manner as in Example 1. As a result, it had a ring pattern in RHEED showing inferiority in the crystallinity and provided a Hall mobility of 1 $cm^2/V.sec$.

It was found the resultant film was a practically unacceptable polycrystalline silicon film.

EXAMPLE 4

There was formed a polycrystalline semiconductor film on an insulating substrate using the MW-PCVD apparatus shown in FIG. 8(A).

As the insulating substrate, there was used a Corning No. 7059 glass plate.

Said glass plate was placed on the surface of the conductive substrate holder 802, and it was heated to and maintained at 300° C.

The film-forming chamber 804 was evacuated to a vacuum of about $1 \times 10^{-6}$ Torr by actuating the vacuum pump (not shown). $H_2$ gas and Ar gas were introduced through the gas feed pipe 813 into the plasma generation space 808 at respective flow rates of 10 sccm and 5 sccm. At the same time, $SiH_4$ gas was introduced through the gas feed pipe 814 into the film-forming chamber 804 at a flow rate of 10 sccm. The inner pressure was controlled to a vacuum of about 5 mTorr by regulating the exhaust valve (not shown). Then, the microwave power source (not shown) was switched on to apply a microwave power of 300 W through the waveguide 810 and the bell jar 811 into the plasma generation space 808. Concurrently, the RF generator 800 was switched on to apply a high frequency voltage of 100 V with a frequency of 50 MHz to the conductive substrate holder 802. Thus, there was formed a 1.5 μm thick polycrystalline silicone film on the glass plate with a deposition rate of 17 A/sec.

The resultant film was examined in the same manner as in Example 1.

As a result, it had a spot pattern in RHEED showing superiority in the crystallinity and provided a Hall mobility of 20 $cm^2/V.sec$.

It was found that the resultant film was a high quality polycrystalline silicon semiconductor film.

COMPARATIVE EXAMPLE 3

The procedures of Example 4 were repeated, except that the RF generator was switched off and thus no high frequency voltage was applied to the conductive substrate holder 802, to thereby form a deposited film on a Corning No. 7059 glass plate.

The resultant film was examined in the same manner as in Example 1. As a result, it had a halo pattern in RHEED showing non-crystallinity (amorphous) and provided a Hall mobility of 0.7 $cm^2/v.sec$.

It was found that the resultant film was an amorphous silicon film which is inferior in the semiconductor characteristics.

EXAMPLE 5

There was formed a polycrystalline ZnSe semiconductor film on an insulating substrate using the MW-PCVD apparatus shown in FIG. 7.

As the insulating substrate, there was used a Corning No. 7059 glass plate.

Said glass plate was placed on the surface of the conductive substrate holder 708, and it was heated to and maintained at 350° C.

The plasma generation chamber 701 and the film-forming chamber 702 were evacuated to a vacuum of about $8 \times 10^{-7}$ Torr by actuating the vacuum pump (not shown). $H_2$ gas and $Se(CH_3)_2$ gas were introduced through the gas feed pipe 705 into the plasma generation chamber 701 at respective flow rates of 8 sccm and 3 sccm.

At the same time, $Zn(CH_3)_2$ gas was introduced through the gas feed pipe 706 into the film-forming chamber 702 at a flow rate of 1 sccm.

The inner pressure of the film-forming chamber 702 was controlled to a vacuum of about $2 \times 10^{-3}$ Torr by regulating the exhaust valve (not shown). Then, the electro-magnet was actuated to apply a magnetic field of 1000 Gauss in the plasma generation chamber 701, and at the same time, the microwave power source was switched on to apply a microwave power of 200 W through the microwave introducing window 703 into the plasma generation chamber 701. Concurrently, the RF generator was switched on to apply a high frequency voltage of 200 V with a frequency of 50 MHz through the impedance matching circuit 714 to the conductive substrate holder 708. Thus, film formation was carried out to form a 2.6 μm thick polycrystalline ZnSe film on the glass plate.

The resultant film was examined in the same manner as in Example 1.

As a result, it had a spot pattern in RHEED showing superiority in the crystallinity and provided a Hall mobility of 45 $cm^2/V.sec$ It was found that the resultant film was a high quality polycrystalline ZnSe semiconductor film.

EXAMPLE 6

Figure 9:
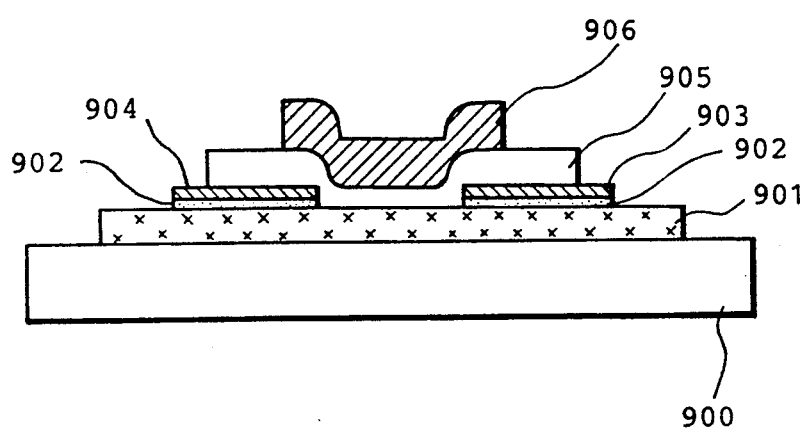
FIG. 9 is a cross-sectional view schematically illustrating a TFT having the semiconductor layer comprising a polycrystalline silicon film formed by the MW-PCVD process of the present invention which was prepared in Example 6 or Example 7 of the present invention.

There was prepared a TFT having the constitution shown in FIG. 9 which has a semiconductor layer formed by the MW-PCVD process of the present invention.

In FIG. 9, numeral reference 900 is a transparent insulating substrate; numeral reference 901 is a polycrystal semiconductor layer; numeral reference 902 is a layer doped with an impurity (doped layer); numeral reference 903 is a source electrode; numeral reference 904 is a drain electrode; numeral reference 905 is a gate insulating film; and numeral reference 906 is a gate electrode.

The foregoing TFT was prepared in the following way. That is, there was firstly formed a 300 Å thick polycrystalline silicon semiconductor film to be the polycrystal semiconductor layer 901 on a Corning No. 7059 glass plate as the transparent insulating substrate 900 by repeating the foregoing film-forming procedures of Example 1. On the semiconductor layer 901 thus formed was formed a doped film of n+ type as the doped layer 902 by repeating the foregoing film-forming procedures of Example 1 wherein $PH_3$ gas was additionally introduced into the film-forming chamber 702. On the doped layer 902 was formed a 1000 Å thick Al film by the conventional E.B. evaporation method. The doped film and the Al film were subjected to patterning by photolithography. Thus, there were formed the source electrode 903 and the drain electrode 904. Then, a 2500 Å thick silicon nitride film as the gate insulating film 905 was formed by the conventional plasma CVD method wherein $SiH_4$ gas and $NH_3$ gas were used. On the gate insulating film thus formed was formed a 5000 Å thick Al film by the conventional E.B. evaporation method. The Al film was subjected to patterning by photolithography to thereby form the gate electrode 906. Thus, there was obtained a polycrystalline silicon TFT.

The resultant TFT was evaluated by the conventional method. As a result, it exhibited an ON/OFF current ratio of $8 \times 10^5$ and a carrier mobility of 52 $cm^2/V.sec$.

Thus, it has been found that this TFT excels in the TFT characteristics and is desirably usable in practice.

EXAMPLE 7

The procedures of Example 6 were repeated, except that the Corning No. 7059 glass plate was replaced by a soda-lime glass, to thereby obtain a polycrystalline silicon TFT.

As a result of evaluating this TFT, it exhibited an ON/OFF current ratio of $4 \times 10^5$ and a carrier mobility of 31 $cm^2/V.sec$.

Thus, it has been found that this TFT excels in the TFT characteristics and is desirably usable in practice.

TABLE 1

| frequency | gas used & its flow rate | discharge stability | reverse microwave power | minimum microwave power required for maintaining discharge | sharpness of ion energy profile | total evaluation |
|---|---|---|---|---|---|---|
| 13.56MHz | $H_2$ 5sccm | O | ⊙ | O | X | X |
| | $H_2$/Ar 4/1sccm | ⊙ | ⊙ | ⊙ | X | X |
| | $H_2$/Ar 2.5/2.5sccm | ⊙ | O | ⊙ | X | X |
| 20MHz | $H_2$ 5sccm | O | ⊙ | O | Δ | Δ |
| | $H_2$/Ar 4/1sccm | ⊙ | ⊙ | ⊙ | Δ | Δ |
| | $H_2$/Ar 2.5/2.5sccm | ⊙ | O | ⊙ | Δ | Δ |
| 25MHz | $H_2$ 5sccm | ⊙ | ⊙ | O | O | O |
| | $H_2$/Ar 4/1sccm | ⊙ | ⊙ | ⊙ | O | O |
| | $H_2$/Ar 2.5/2.5sccm | ⊙ | O | ⊙ | O | O |
| 40.7MHz | $H_2$ 5sccm | O | ⊙ | O | ⊙ | ⊙ |
| | $H_2$/Ar 4/1sccm | ⊙ | ⊙ | ⊙ | ⊙ | ⊙ |
| | $H_2$/Ar 2.5/2.5sccm | ⊙ | ⊙ | ⊙ | ⊙ | ⊙ |
| 100MHz | $H_2$ 5sccm | O | ⊙ | O | ⊙ | O |
| | $H_2$/Ar 4/1sccm | ⊙ | ⊙ | ⊙ | ⊙ | ⊙ |
| | $H_2$/Ar 2.5/2.5sccm | ⊙ | O | ⊙ | ⊙ | O |
| 200MHz | $H_2$ 5sccm | Δ | ⊙ | O | ⊙ | Δ |
| | $H_2$/Ar 4/1sccm | ⊙ | ⊙ | O | ⊙ | O |
| | $H_2$/Ar 2.5/2.5sccm | O | Δ | ⊙ | ⊙ | Δ |

TABLE 1-continued

| frequency | gas used & its flow rate | discharge stability | reverse microwave power | minimum microwave power required for maintaining discharge | sharpness of ion energy profile | total evaluation |
|---|---|---|---|---|---|---|
| 500MHz | H₂ 5sccm | Δ | ○ | Δ | ⊙ | Δ |
| | H₂Ar 4/1sccm | Δ | ○ | ○ | ⊙ | Δ |
| | H₂/Ar 2.5/2.5sccm | Δ | Δ | ○ | ⊙ | Δ |
| 1.0GHz | H₂ 5sccm | X | ○ | X | — | X |
| | H₂Ar 4/1sccm | X | ○ | Δ | — | X |
| | H₂Ar 2.5/2.5sccm | X | Δ | ○ | — | X |

Note:
⊙: excellent
○: good
Δ: acceptable
X: not acceptable
—: could not be measured

What is claimed is:

1. A process for forming a polycrystalline semiconductor film on an insulating substrate which comprises using a MWPCVD apparatus comprising a plasma generation chamber provided with a microwave introducing means, and a film-forming chamber connected through a grid electrode to said plasma generation chamber, said film-forming chamber containing said insulating substrate positioned on a substrate holder made of a conductive material being installed therein, producing plasma by contacting a film-forming raw material gas with a microwave energy applied through said microwave introducing means in said plasma generation chamber and introducing said plasma into said film-forming chamber while maintaining the inner pressure of said film-forming chamber at a vacuum of $1 \times 10^{-4}$ to $5 \times 10^{-3}$ Torr and applying a high frequency voltage with a frequency in the range of from 20 MHz to 500 MHz between said grid electrode and said substrate holder to thereby cause the formation of polycrystalline semiconductor film on said insulating substrate maintained at a temperature in the range of from 200° to 400° C.

2. The process according to claim 1, wherein said high frequency voltage is of 100 to 500 V.

3. A process for forming a polycrystalline semiconductor film on an insulating substrate which comprises using a MWPCVD apparatus comprising a plasma generation chamber provided with a microwave introducing means and a magnetic field effecting means, and a film-forming chamber connected through a grid electrode to said plasma generation chamber, said film-forming chamber containing said insulating substrate positioned on a substrate holder made of a conductive material being installed therein, producing plasma by contacting a film-forming raw material gas with a microwave energy applied through said microwave introducing means in said plasma generation chamber while effecting a magnetic field into said plasma generation chamber by said magnetic field effecting means and introducing said plasma into said film forming chamber while maintaining the inner pressure of said film-forming chamber at a vacuum in the range of from $1 \times 10^{-6}$ to $5 \times 10^{-3}$ Torr and applying a high frequency voltage of a frequency in the range of from 20 MHz to 500 MHz between said grid electrode and said substrate holder to thereby cause the formation of polycrystalline semiconductor film on said insulating substrate maintained at a temperature in the range of from 200° to 400° C.

4. The process according to claim 3, wherein said high frequency voltage is of 100 to 500 V.

* * * * *

UNITED STATES PATENT AND TRADEMARK OFFICE
CERTIFICATE OF CORRECTION

PATENT NO. : 5,192,717
DATED : March 9, 1993
INVENTOR(S) : SOICHIRO KAWAKAMI, ET AL.

It is certified that error appears in the above-identified patent and that said Letters Patent is hereby corrected as shown below:

ON THE TITLE PAGE:

IN [30] FOREIGN APPLICATION PRIORITY DATA

"Apr. 20, 1990 [JP] Japan ..... 1-102926" should read
--Apr. 20, 1990 [JP] Japan ......2-102926--.

IN [56] REFERENCES CITED

Under U.S. PATENT DOCUMENTS:
"Liv et al." should read --Liu et al.--.

COLUMN 1

Line 21, "through the decompose gas" should read
--the decomposed gas through--.
Line 40, "transisters" should read --transistors--.

COLUMN 3

Lines 51-52, "followed" should read --allowed--.

COLUMN 4

Line 16, "comprised of" should read --comprising--.

COLUMN 7

Line 14, "fact." should read --facts.--.

COLUMN 8

Line 45, "film a" should read --film at a--.

UNITED STATES PATENT AND TRADEMARK OFFICE
CERTIFICATE OF CORRECTION

PATENT NO. : 5,192,717
DATED : March 9, 1993
INVENTOR(S) : SOICHIRO KAWAKAMI, ET AL.

It is certified that error appears in the above-identified patent and that said Letters Patent is hereby corrected as shown below:

COLUMN 9

Line 9, "about" should be deleted.
    Line 64, "fallowed" should read --followed--.

COLUMN 12

Line 7, "about" should be deleted.

COLUMN 13

Line 13, "one" should read --on--.
    Line 16, "conclusion" should read --conclusion,--.
    Line 21, "gas." should read --gas,--.

COLUMN 15

Line 54, "frequency" (first occurrence) should be deleted.

COLUMN 16

Line 25, "to that" should read --to the fact that--.
    Line 44, "respect its" should read --respect to its--.
    Line 55, "were" should read --are--.

COLUMN 17

Line 3, "insulating" should read --insulating substrate--.

COLUMN 18

Line 17, "glass," should read --glass or--.

UNITED STATES PATENT AND TRADEMARK OFFICE
CERTIFICATE OF CORRECTION

PATENT NO. : 5,192,717
DATED : March 9, 1993
INVENTOR(S) : SOICHIRO KAWAKAMI, ET AL.

It is certified that error appears in the above-identified patent and that said Letters Patent is hereby corrected as shown below:

COLUMN 19

Line 4, "C2H$_2$" should read --$C_2H_2$--.

COLUMN 20

Line 1, "reference" should read --reference 511--.
Line 58, "100 Gauss." should read --1000 Gauss.--.
Line 63, "be comprised of" should read --comprise--.

COLUMN 21

Line 38, "an" should read --a--.

COLUMN 22

Line 50, "875" should read --875--.
Line 60, "1.5 A/sec." should read --1.5 Å/sec.--.

COLUMN 23

Line 11, "13 A/sec." should read --13 Å/sec.--.
Line 24, "17 A/sec." should read --17 Å/sec.--.
Line 29, "equal-" should read --qual- --.
Line 36, "11 A/sec." should read --11 Å/sec.--.
Line 50, "11 A/sec." should read --11 Å/sec.--.

COLUMN 24

Line 17, "17 A/sec." should read --17 Å/sec.--.

UNITED STATES PATENT AND TRADEMARK OFFICE
CERTIFICATE OF CORRECTION

PATENT NO. : 5,192,717
DATED : March 9, 1993
INVENTOR(S) : SOICHIRO KAWAKAMI, ET AL.

It is certified that error appears in the above-identified patent and that said Letters Patent is hereby corrected as shown below:

<u>COLUMN 26</u>

Line 3, "1000 A" should read --1000 Å--.
Line 8, "2500 A" should read --2500 Å--.
Line 12, "5000 A" should read --5000 Å--.

Signed and Sealed this

Twenty-fifth Day of January, 1994

Attest:

BRUCE LEHMAN

*Attesting Officer*          *Commissioner of Patents and Trademarks*